(12) United States Patent
Takigawa et al.

(10) Patent No.: US 9,985,409 B2
(45) Date of Patent: May 29, 2018

(54) LASER DEVICE CAPABLE OF USING SMALL-SIZED CHILLER

(71) Applicant: FANUC CORPORATION, Yamanashi (JP)

(72) Inventors: Hiroshi Takigawa, Yamanashi (JP); Yuji Nishikawa, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days. days.

(21) Appl. No.: 15/483,228

(22) Filed: Apr. 10, 2017

(65) Prior Publication Data

US 2017/0294755 A1    Oct. 12, 2017

(30) Foreign Application Priority Data

Apr. 12, 2016   (JP) .................................. 2016-079692

(51) Int. Cl.
  *H01S 3/04*    (2006.01)
  *H01S 3/00*    (2006.01)
  *B23K 26/70*   (2014.01)

(52) U.S. Cl.
  CPC .......... *H01S 3/0407* (2013.01); *B23K 26/703* (2015.10); *H01S 3/0014* (2013.01)

(58) Field of Classification Search
  CPC .... H01S 3/0407; H01S 3/0014; B23K 26/703
  See application file for complete search history.

(56) References Cited

U.S. PATENT DOCUMENTS

| 8,605,763 | B2 * | 12/2013 | Castillo | H05B 33/0854 |
| | | | | 372/29.011 |
| 2005/0064131 | A1 * | 3/2005 | Yamaguchi | G11B 7/243 |
| | | | | 428/64.4 |
| 2016/0047763 | A1 * | 2/2016 | Omichi | G01K 1/14 |
| | | | | 374/161 |
| 2016/0081224 | A1 * | 3/2016 | Terava | F25B 23/00 |
| | | | | 361/700 |

FOREIGN PATENT DOCUMENTS

| JP | 2007-218457 | 8/2007 |
| JP | 2011-49376 | 3/2011 |
| JP | 2012-59993 | 3/2012 |

* cited by examiner

*Primary Examiner* — Xinning Niu
(74) *Attorney, Agent, or Firm* — Wenderoth, Lind & Ponack, L.L.P.

(57) ABSTRACT

A calculation part calculates a maximum temperature reached which is reached by the coolant or component of each part, in the case of machining in accordance with laser machining conditions that were inputted or set, based on the cooling capacity of a chiller, tank volume of the chiller, heat generation amount from the laser oscillator, heat capacity of a cooled part of the laser device, etc. which are recorded in a recording part, and the temperature of each part measured by temperature detection parts, etc. In the case that the maximum temperature reached would exceed the allowed maximum temperature, a warning is made prior to starting laser machining.

10 Claims, 8 Drawing Sheets

LASER DEVICE CAPABLE OF USING SMALL-SIZED CHILLER

This application is based on and claims the benefit of priority from Japanese Patent Application No. 2016-079692, filed on 12 Apr. 2016, the content of which is incorporated herein by reference.

BACKGROUND OF THE INVENTION

Field of the Invention

The present invention relates to a laser device for performing machining such as cutting and welding on a workpiece that is capable of using a small-sized chiller of a specification matching the laser beam output conditions, as a circulation-type coolant supply device (chiller) that supplies coolant such as cooling water for cooling heat generating parts such as a laser oscillator, in the case of not using at conditions such that a laser device outputs a laser beam continuously for an extended time at the rated maximum optical output.

Normally, a chiller having a cooling capacity surpassing the heat generation amount when outputting a laser beam over a long time at the rated maximum optical output by the laser device is selected as the chiller for cooling a heat-generating part such as the laser oscillator of a laser device. However, chillers having such a large cooling capacity are generally large sized and require a large installation area, and are cost-wise expensive. On the other hand, in the laser machining normally conducted by the user of a laser device, due to using lower optical output than the rated maximum optical output, the duty cycle (usage rate) of laser oscillation being low, and the continuous machining time being short, there has been a demand for using a small-sized chiller of small cooling capacity matching the service conditions of the laser device.

However, in the case of using a small-sized chiller of small cooling capacity, if performing laser machining continuously for a longer time or performing laser oscillation at a higher duty cycle than that initially planned, the temperature of a heat generating part such as the laser oscillator will rise to the permitted temperature or higher, and there is a risk of the laser oscillator, etc. receiving damage. For this reason, although it is possible to prevent the laser oscillator, etc. from receiving damage if configuring to interrupt laser machining by detecting the temperature of the heat generating part such as the laser oscillator or the coolant and stopping the laser oscillation when detecting an excessive temperature rise, there has been a problem in that the workpiece in machining may become a defective product and can no longer be used.

The present invention is related to a laser device having a function of displaying a warning to notify that there is a possibility of excessive temperature rise occurrence in the case of there being a possibility of the heat generating part such as the laser oscillator excessively rising in temperature during laser machining, at the moment when the laser machining conditions are set (inputted), as well as suggesting alternative laser machining conditions such as setting the machining time to be shorter, or starting machining after the temperature of coolant drops, or a function of executing laser machining by automatically replacing laser machining conditions that have been set with alternative laser machining conditions, so that a small-sized chiller of small cooling capacity that matches the normal use conditions of the laser device can be utilized without troubles such as laser oscillation stopping during laser machining.

Related Art

At normal laser machining conditions, even if a small-sized chiller having small cooling capacity and a small coolant tank volume can be used without problem, the temperature of the laser oscillator, coolant or the like will rise excessively according to the laser machining conditions. With the conventional technology, if the temperature of the laser oscillator, coolant or the like rises excessively, the laser oscillation has been stopped, or the laser output has been lowered, even if in the middle of laser machining.

For example, in Patent Document 1, although the laser device use is not limited, it discloses "a cooling liquid circulating device equipped with a liquid feed means for circulating a cooling liquid to a circulation channel for cooling a thermal load; a temperature control means for adjusting temperature by at least cooling a cooling liquid that has returned by passing through the circulation channel, the device comprising: a) a temperature detection means for detecting temperature of the cooling liquid that is adjusted by the temperature control means; and b) an abnormality detection means for determining as being an abnormal state when a detected temperature by the temperature detection means is at least a predetermined abnormal temperature, after as moment when a predetermined time has elapsed since operation start, and comprising an operation control means for stopping operation when abnormality is detected". In the case of employing in a laser device, since the laser oscillation of the laser device must be stopped prior to stopping the operation of the cooling liquid circulation device, the workpiece in the middle of laser machining may become a defective product.

In addition, in Patent Document 2, it is discloses "A laser machining system comprising: a laser oscillator that outputs a laser beam; a laser beam machine that machines a workpiece with the laser beam outputted from the laser oscillator; a cooling device that supplies cooling water for cooling the laser oscillator; a temperature measuring means for measuring the temperature of cooling water supplied from the cooling device; and a control device that controls the laser oscillator so as to lower a laser beam output value of the laser oscillator in a case of a cooling water temperature measured by the temperature measuring means having exceeds a reference value". Since the laser beam output value of the laser oscillator is lowered in the case of the cooling water temperature having exceeded a reference value, the workpiece under machining may nevertheless become a defective product.

In addition, Patent Document 3 discloses "a laser device provided with a cooling mechanism having a oscillation-part cooling passage provided within a laser oscillation part that oscillates a laser beam, a coolant supply passage leading a coolant to the oscillation-part cooling passage; and a coolant discharge passage circulating the coolant led from the oscillation-part cooling passage, the laser device comprising: a laser oscillation control part that drives and controls the laser oscillation part; an on-off valve that opens and closes the coolant supply passage; an on-off valve control part that controls the on-off valve to open and close; and an abnormality detection means for detecting an abnormality in the cooling mechanism, wherein the laser oscillation control part stops oscillation of the laser beam and the on-off valve control part closes the on-off valve, in a case of an abnormality in the cooling mechanism being detected by the abnormality detection means". Although a case of the temperature detection part detecting the temperature of cooling water is also included in the abnormality detection means for detecting an abnormality in the cooling mechanism, since the oscillation of the laser beam is stopped in the case of an abnormality in the cooling mechanism being detected, there is no change in that the workpiece under machining may become a defective product.

Patent Document 1: Japanese Unexamined Patent Application, Publication No. 2007-218457

Patent Document 2: Japanese Unexamined Patent Application, Publication No. 2011-49376

Patent Document 3: Japanese Unexamined Patent Application, Publication No. 2012-59993

SUMMARY OF THE INVENTION

As described above, if the temperature of coolant or the like exceeds a reference value during laser machining, since the laser oscillation is stopped, or the laser beam output is decreased, the workpiece under laser machining may become a defective product, and technology that can safely use a small-sized chiller in a laser device without troubles such as defective product generation has not been disclosed, and thus there has been no alternative but to permit the case of the workpiece under machining becoming a defective product, or using a large-sized chiller having excessive cooling capacity for normal machining conditions, and wasteful costs have arisen in either case. The object of the present invention, and is to provide a laser device taking the above such situation into account that is capable of employing a small-sized chiller of small cooling capacity that can be used without problems at normal laser machining conditions, without troubles such as laser oscillation stopping during laser machining.

In order to achieve the aforementioned object, the first aspect of the invention provides a laser device (e.g., the laser device 1 described later) that cools at least heat emanating from a laser oscillator (e.g., the laser oscillator 3 described later) by way of a circulation-type coolant supply device (chiller) (e.g., the chiller 2 described later), the laser device including: at least one laser oscillator; a power supply unit (e.g., the power supply unit 4 described later) that supplies electric power for laser oscillation to the laser oscillator; an output light detection part (e.g., the output light detection part 5 described later) that detects laser beam output from the laser oscillator; a laser optical system (e.g., the laser optical system 12 described later) for outputting a laser beam from the laser device; at least one temperature detection part (e.g., the temperature detection part 6 described later) that detects temperature of coolant or a component for which temperature rises by heat generation from at least the laser oscillator; an input unit (e.g., the input unit 8 described later); a display unit (e.g., the display unit 7 described later); a recording part (e.g., the recording part 10 described later) that records a characteristics of the laser device including an optical output characteristics of the laser oscillator, and a characteristics of the chiller; a calculation part (e.g., the calculation part 9 described later) that calculates a state of the laser device; and a control unit (e.g., the control unit 11 described later) that controls each part of the laser device, in which the calculation part calculates, according to a command from the control unit, the state of the laser device based on a cooling capacity of the chiller and tank volume (e.g., the volume of the tank 15 described later) of the chiller, at least a heat generation amount from the laser oscillator, and heat capacity of a cooled part of the laser device to be effectively cooled by the coolant, which are recorded in the recording part, relative to laser machining conditions including at least one set of output command data among optical output command data to the laser oscillator and power output command data for the laser oscillator to the power supply unit, which were inputted through the input unit or set and in which the control unit has at least one function among a function of displaying on the display unit a warning of excessive temperature rise and a function of recording a warning of excessive temperature rise in the recording part, prior to starting laser machining, in a case of determining that there is a possibility of the temperature of the coolant or component for which the temperature rises by heat generation from at least the laser oscillator exceeding predetermined respective allowed temperatures, at the laser machining condition that was inputted or set, by referencing a calculation result of the state of the laser device calculated by the calculation part.

According to the first aspect of the present invention, since a warning of excessive temperature rise is displayed on the display unit, or the warning of excessive temperature rise is recorded in the recording part prior to starting laser machining, it is possible to overcome the problem in which the workpiece under machining becomes inferior due to starting laser machining without noticing that there is a possibility of the coolant or heat generating part such as the laser oscillator excessively rising in temperature during laser machining, then detecting that the coolant or heat generating part such as the laser oscillator has excessively risen in temperature, and stopping laser oscillation or decreasing laser beam output.

According to a second aspect of the invention, the control unit in the first aspect further has at least one function among: a function of displaying on the display unit an alternative laser machining condition at which the temperature of the coolant or the component for which the temperature rises by heat generation from at least the laser oscillator will not exceed the predetermined respective allowed temperature, a function of recording the alternative laser machining condition in the recording part, and a function of executing laser machining by automatically replacing the laser machining condition with the alternative laser machining condition, in a case of determining that there is a possibility of the temperature of the coolant or component for which the temperature rises by heat generation from at least the laser oscillator exceeding the predetermined respective allowed temperatures, at the laser machining condition that was inputted through the input unit or set.

According to the second aspect of the present invention, even if using a small-sized chiller of small cooling capacity, in the case of there being a possibility of the temperature rise of coolant or a component for which the temperature rises by the heat generation from the laser oscillator 3, etc. exceeding the predetermined respective allowed temperatures, since the alternative laser machining conditions are displayed, the problem of the objective machining not being possible can be avoided by setting again to the displayed laser machining conditions. By having a function of automatically replacing with alternative laser machining conditions, it is possible to allow the laser machining to be concluded without stopping, even without a person intervening.

According to a third aspect of the invention, the control unit in the first or second aspect of the invention further: sends a command to the power supply unit so as to supply at least one of a current or voltage of a predetermined value to the laser oscillator, following a predetermined schedule that is set; receives power data supplied to the laser oscillator from the power supply unit and optical output data from the output light detection part; and updates at least one characteristics recorded in the recording part among the optical output characteristics of the laser device representing a characteristics of a laser beam output relative to current or voltage supplied from the power supply unit, and a heat generation characteristics of the laser oscillator representing a heat generation amount of the laser oscillator relative to current or voltage supplied from the power supply unit.

According to the third aspect of the present invention, in the case of the characteristics of the laser oscillator changing, it is possible to output an optical output in accordance with the command by updating the optical output characteristics of the laser device, and it is possible accurately determine whether there is a possibility of the temperature rise of the coolant or component for which the temperature rises by the heat generation from the laser oscillator, etc. exceeding the predetermined respective allowed temperatures, by updating the heat generation characteristics of the laser oscillator.

According to the fourth aspect, in the laser device as described in any one of the first to third aspects of the invention, at least one temperature detection part among the temperature detection parts is a temperature detection part that detects temperature of an environment in which at least one device among the laser device and the chiller is installed; at least one set of data among environmental temperature dependency data of the cooling capacity of the chiller and environmental temperature dependency data of a heat quantity infiltrating from outside to the cooled part of the laser device is recorded in the recording part; the calculation part further calculates the state of the laser device using at least one set of data among data of the cooling capacity of the chiller and data of a heat quantity infiltrating from outside to the cooled part, at the environmental temperature detected by the temperature detection part; and the control unit further determines whether there is a possibility of the temperature of the coolant or component for which the temperature rises by heat generation from at least the laser oscillator exceeding predetermined respective allowed temperatures, at the laser machining condition that was inputted or set, by referencing a calculation result of the state of the laser device calculated by the calculation part.

According to the fourth aspect of the present invention, by determining whether there is a possibility of the temperature rise of coolant or components such as the laser oscillator exceeding the predetermined respective allowed temperatures by considering the change in the cooling capacity of the chiller, or change in the heat quantity infiltrating from outside to the cooled part of the laser device from the environmental temperature changing, it is possible to accurately determine also in a case of the environmental temperature being high.

According to a fifth aspect of the invention, the control unit in any one of the first to fourth aspects of the invention further has a function of stopping laser oscillation or decreasing laser beam output, in a case of a temperature rise of coolant or a component for which temperature rises by heat generation from at least the laser oscillator having exceeded the predetermined respective allowed temperatures.

According to the fifth aspect of the present invention, also in the case of the temperature of the coolant or component for which the temperature rises such as the laser oscillator excessively rising, and exceeding the predetermined respective allowed temperatures, contrary to expectation by the trouble of the chiller and so on, it is possible to avoid damage or the like to the laser oscillator.

According to the sixth aspect of the invention, the control unit in any one of the first to fifth aspects of the invention further has at least one function among a function of displaying a specification of a required chiller for machining without changing the laser machining conditions on the display unit, by referencing a calculation result of the state of the laser device calculated by the calculation part, according to a request inputted from the input unit or a setting, and a function of recording in the recording part, in a case of determining that there is a possibility that the temperature rise of the coolant or component for which the temperature rises by heat generation from at least the laser oscillator will exceed predetermined respective allowed temperatures, for the laser machining condition that was inputted from the input unit or set.

According to the sixth aspect of the present invention, it is possible to immediately notice with what cooling capacity and tank volume equipped chiller would be best to replace, in the case of the necessity arising to consider replacement of the chiller.

According to the seventh aspect of the invention, in the laser device as described in any one of the first to sixth aspects of the invention, the recording part, in order that the calculation part calculates whether there is a possibility of the temperature of the coolant or component for which the temperature rises by heat generation from at least the laser oscillator exceeding predetermined respective allowed temperatures, at the laser machining condition that was set, based on the cooling capacity of the chiller and tank volume of the chiller, heat generation amount from at least the laser oscillator and heat capacity of the cooled part of the laser device to be effectively cooled by the coolant, according to a command from the control unit, records in advance in the recording part at least a computational expression for calculating a heat generation amount from at least the laser oscillator according to the laser machining condition, and a computational expression that calculates a temperature rise of the coolant or the component for which temperature rises by heat generation from at least the laser oscillator, in addition to recording in advance at least the cooling capacity of the chiller and tank volume of the chiller, and heat capacity of the cooled part of the laser device to be effectively cooled by the coolant.

According to the seventh aspect of the present invention, it is possible to easily calculate the temperature rise of the component or coolant by recording computational expressions in the recording part, in addition to numerical information required in calculation.

According to an eighth aspect of the invention, in the laser device as described in any one of the first to seventh aspects of the invention, at least one of the temperature detection parts is installed at a position for detecting at least one temperature among the temperature of a cooled portion of the laser oscillator and the temperature of the coolant, and data indicating a relationship between the optical output characteristics of the laser device and the temperature detected by the temperature detection part that detects the at least one temperature among the temperature of the cooled portion of the laser oscillator and the temperature of the coolant is recorded in the recording part, and the control unit further has a function of adjusting a optical output command so that laser output becomes stable, according to a change in the temperature of the coolant or the component for which the temperature rises by heat generation from at least the laser oscillator, by referencing the data recorded in the recording part that indicates the relationship between the optical output characteristics of the laser device and the temperature detected by the temperature detection part that detects the at least one temperature among the temperature of the cooled portion of the laser oscillator and the temperature of the coolant.

According to the eighth aspect of the present invention, since the cooling capacity of the chiller is small, the temperature of the laser oscillator and coolant will change; however, even if the temperature changes, it is possible to stabilize the laser output.

According to a ninth aspect of the invention, in the laser device as described in any one of the first to eighth aspects of the invention, the control unit is a numerical control.

According to the ninth aspect of the present invention, if a numerical control, it is possible to impart both functions of the calculation part and recording part, and it becomes possible to have the above-mentioned such function, without additions such as new components, in the numerical control for controlling the laser device.

According to a tenth aspect of the invention, in the laser device as described in any one of the first to ninth aspects, the laser device shares the control unit between a plurality of the laser devices.

According to the tenth aspect of the present invention, a cost reduction is achieved by sharing one control unit or numerical control with a plurality of the laser devices.

According to the laser device of the present invention, due to having a function of emitting a warning at the stage of setting the laser machining conditions, or executing laser machining by automatically replacing the set laser machining conditions with alternative laser machining conditions, prior to starting the laser machining, in the case of there being a possibility of the temperature of the laser oscillator or coolant exceeding the predetermined respective allowed temperatures, since the problem of a workpiece under laser machinig becoming inferior as a result of detecting an excessive temperature rise of the laser oscillator or coolant, and laser oscillation stopping or decreasing laser beam output during laser machining will not arise, an effect is exerted in becoming possible to perform laser machining without incurring wasteful costs, even if selecting a small-sized chiller that is low cost and has a small occupying space.

DETAILED DESCRIPTION OF THE INVENTION

Figure 1:
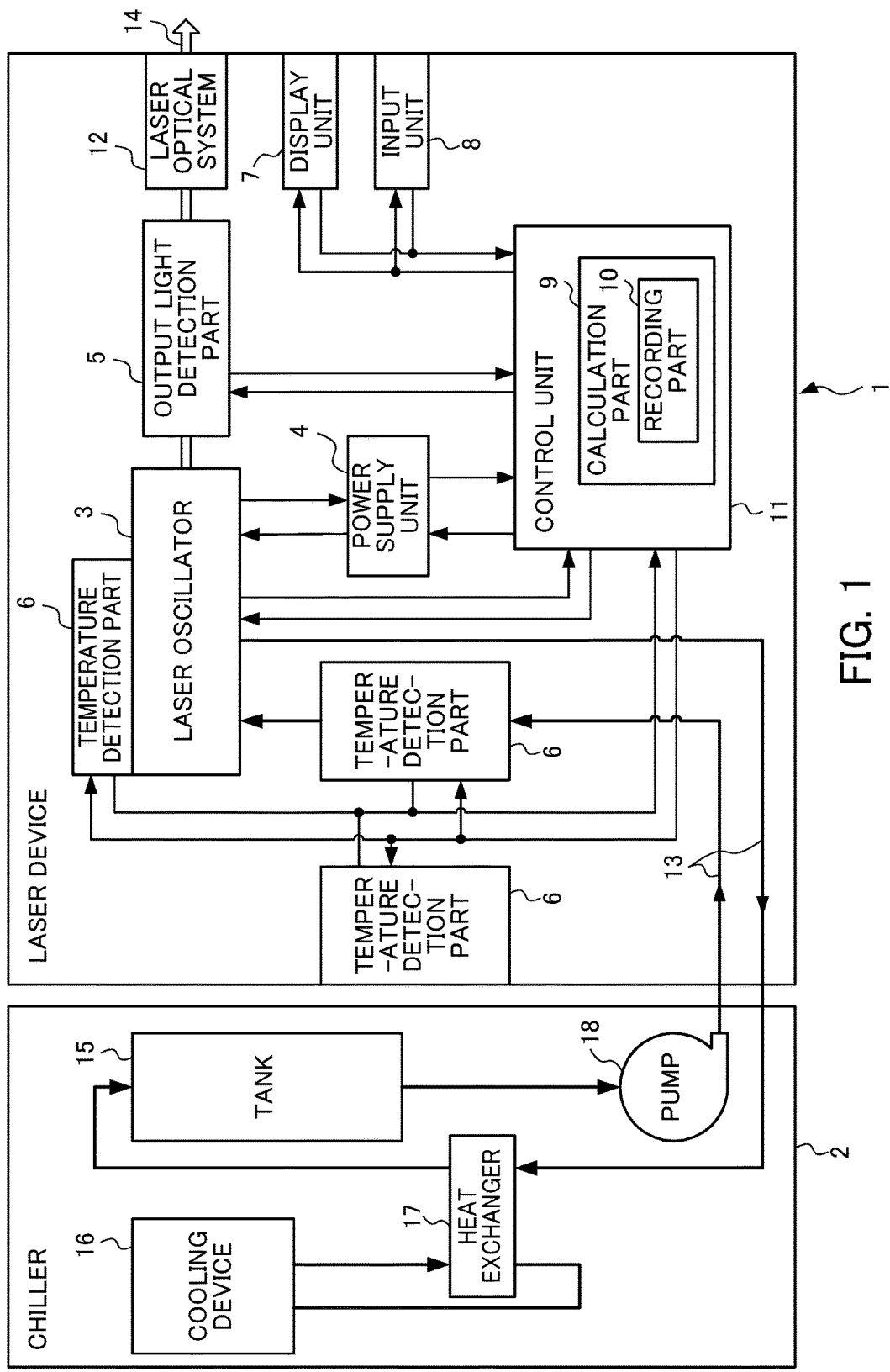
FIG. 1 is a block diagram showing a conceptual configuration of a laser device according to a first embodiment.

Hereinafter, a first embodiment of the present invention will be explained in detail while referencing the drawings. It should be noted that, in the explanations of the modified example 1 of the first embodiment and later, the same reference symbols will be assigned for configurations shared with the first embodiment, and explanations thereof will be omitted. FIG. 1 is a block diagram showing a conceptual configuration of a laser device according to the first embodiment of the present invention. A laser device 1 of the first embodiment that cools heat generated by a laser oscillator 3, etc. by way of a circulation-type coolant supply device (chiller) 2 includes: at least one laser oscillator 3, a power supply unit 4 that supplies electric power for laser oscillation to the laser oscillator 3, an output beam detection part 5 that detects laser beam output from the laser oscillator 3, a laser optical system 12 for outputting a laser beam from the laser device 1, at least one temperature detection part 6 that detects the temperature of coolant or a component for which the temperature rises by heat generation from the laser oscillator 3, etc., an input unit 8, a display unit 7, a recording unit 10 that records characteristics of the laser device 1 including optical output characteristics of the laser oscillator 3 and characteristics of the chiller 2, a calculation unit 9 that calculates a state of the laser device, and a control unit 11 that controls each part of the laser device.

In the laser device 1, by referencing the results calculated by the calculation unit 9 based on the cooling capacity of the chiller 2 and tank capacity of the chiller 2, heat generation amount from the laser oscillator 3, etc. and heat capacity of the cooled part of the laser device 1 to be effectively cooled by the coolant, which are recorded in the recording part 10, in relation to laser machining conditions including at least either output command data among the optical output command data to the laser oscillator 3, and electric power output command data to the power supply unit 4 inputted via the input unit 8 or set, in accordance with a command from the control unit 11, the control unit 11 displays, on the display unit 7, a warning of excessive temperature rise such as being a possibility of the laser oscillator 3, etc. rising excessively in temperature to exceed the allowed temperature, if performing machining at the laser machining conditions including at least one set of output command data among the optical output command data to the laser oscillator 3 and power output command data to the power supply unit 4 that were inputted or set, prior to starting laser machining, in the case of determining that there is a possibility of the temperature of the coolant or component for which the temperature rises by the heat generation from the laser oscillator 3 exceeding the predetermined respective allowed temperatures at the laser machining conditions inputted or set. As described later, in the case of executing laser machining by automatically replaced with alternative laser machining conditions, display of a warning on the display unit 7 is not necessary, and the warning may be recorded in the recording part 10.

Since a warning is emitted in the case of there being a possibility of the coolant or heat generating part such as the laser oscillator 3 exceeding the predetermined respective allowed temperatures during laser machining, even if selecting a small-sized chiller that is low cost and has a small occupying space, it is possible to overcome the problem in that the workpiece under machinig becomes inferior due to starting laser machining without noticing that there is a possibility of the coolant or heat generating part such as the laser oscillator 3 excessively rising in temperature during laser machining, then detecting that the coolant or heat generating part such as the laser oscillator 3 has excessively risen in temperature, and stopping laser oscillation or decreasing laser beam output. A concrete example of the calculations performed in the calculation unit 9 will be described later.

In FIG. 1, although only one of the laser oscillators 3 is illustrated, a plurality of the laser oscillators 3 may be provided. In addition, the laser oscillator 3 may be a gas laser oscillator such as a carbon dioxide laser, a solid state laser oscillator including a fiber laser establishing a semiconductor laser as the excitation light source, or a direct diode laser oscillator establishing the semiconductor laser as the laser beam source itself, and the type of laser oscillator is not limited. In the case of providing a plurality of laser oscillators, it may be made a structure that can perform laser oscillation by each of the laser oscillators being controlled independently, and configured so as to be able to simultaneously detect or measure the optical output or optical output characteristics from each of the laser oscillators, by providing at least one output light detection part 5 to each laser oscillator. In addition, in the case of equipping a plurality of laser oscillators, the laser optical system 12 can multiplex the plurality of laser beam sources in the laser optical system by including an optical coupler or the like.

In addition, in FIG. 1, although the white arrow simulatively represents the ray of the laser beam, it is not limited to rays propagating in space and, for example, rays propagating in optical fiber, etc. are also simulatively expressed inclusively thereby. This similarly applies for laser beams output from the laser device 1, and simulatively indicates with the meaning also including a structure provided with a machining head configured so that the laser beam propagates in optical fiber and the laser beam focuses on roughly the surface of the workpiece at the terminal end of the optical fiber.

In addition, FIG. 1 schematically illustrates so that the laser beam penetrates the output light detection part 5; however, as a method of making the laser beam incident on the output light detection part 5, in the case of the rays propagating in space, for example, it is possible to detect a part of the rays diverged by a half mirror, and the light propagating in optical fiber, it is possible to detect light from the terminal end of the optical fiber diverged using an optical divider, and detect leaked light from the cladding of the optical fiber, and the incident structure of light to the output light detection part is not limited to the structure shown in FIG. 1.

Regarding the temperature detection part 6, although temperature detection part 6 that detects the temperature of the laser oscillator 3, the temperature detection part 6 that detects the temperature of the coolant, and the temperature detection part 6 that detects the environmental temperature on the outside of the laser device are being exemplified, the position at which installing the temperature detection part 6 is not limited to these examples, and may be provided at other positions such as the power supply unit 4 for which the temperature inevitably rises, for example. Regarding the temperature detection part 6 that detects the temperature of the laser oscillator 3, although FIG. 1 illustrates being installed outside of the laser oscillator simulatively, in the laser oscillator 3 for which a laser diode serves as the laser light source or excitation light source, it may be installed to a package of a laser diode, a package of a laser diode module including a plurality of laser diodes, or a cooling plate that mounts the laser diode module, and at which location of the laser oscillator 3 it is installed is not limited.

In addition, although FIG. 1 schematically illustrates a structure in which the calculation part 9 is enclosed in the control unit 11, and the recording part 10 is further enclosed in the calculation part 9, it may be a structure in which each is separated, as a matter of course. The recording part 10 and calculation part 9, and the control unit 11 are functional blocks, and it is also possible to treat as achieving a plurality of functions or all three functions by way of one block of the control unit 11, for example. The calculation part 9 and control unit 11 are realized by predetermined software stored in a storage part of a computer being executed by a CPU. The recording part 10 may be realized in the storage part of the computer. In addition, the input unit 8 and display unit 7 may be integrated, and may be configured so as to handle a part of the functions of the input unit 8 with soft keys on the display unit 7.

In addition, FIG. 1 simulatively shows coolant pipes 13 by way of bold lines with arrows. An electromagnetic valve of the inlet pipe and outlet pipe for switching between an influx state and isolated state of coolant from the chiller 2 to the laser device 1, and a bypass pipe with an electromagnetic valve for circulating coolant to the chiller 2 when isolated are omitted. Although FIG. 1 illustrates so as to cool only the laser oscillator 3 with coolant, heat generating parts other than the power supply unit 4 and components receiving heat may also be cooled by coolant. In addition, the internal structure of the chiller 2 in FIG. 1 is an exemplification, and the internal structure of the chiller 2 is not limited thereto. The tank 15 and discharge pump 18 may be equipped outside of the chiller 2.

In addition, it is preferable for the laser device 1 to have at least one function among a function of displaying on the display unit 7 the alternative laser machining conditions obtained using the calculation by the calculation unit 9, and at which the temperature of coolant or a component for which the temperature rises by the heat generation from the laser oscillator 3, etc. will not exceed the predetermined respective allowed temperatures, a function of recording the alternative laser machining conditions in the recording part 10, and a function of conducting laser machining by automatically replacing the laser machining conditions with the alternative laser machining conditions, in the case of the control unit 11 having determined that there is a possibility of the temperature rise of the coolant or a component for which the temperature rises by the heat generation from the laser oscillator 3, etc. exceeding the predetermined respective allowed temperatures at the laser machining conditions inputted via the input unit 8 or set.

If performing machining at laser machining conditions including at least one set of output command data among optical output command data to the laser oscillator 3 and power output command data to the power supply unit 4 that were inputted or set, by simply displaying a warning of being a possibility of the laser oscillator 3, etc. excessively rising in temperature to exceed the allowed temperature, although the occurrence of the temperature of the laser oscillator 3, etc. exceeding the allowed temperature during laser machining, or the workpiece becoming inferior by the laser beam output stopping or decreasing is prevented, the problem in that work stops when it is unknown how to best change the laser machining conditions occurs.

Also in the case of there being a possibility of the temperature rise of coolant or a component for which the temperature rises by the heat generation from the laser oscillator 3, etc. exceeding the predetermined respective allowed temperatures, since the alternative laser machining conditions are displayed such as lengthening of the rest time between continuous machining and continuous machining, or starting machining after waiting for a few minutes as the temperature of the coolant is rising, the problem of the objective machining not being possible can be avoided by setting again to the displayed laser machining conditions. It may be configured so as to display a plurality of alternative laser machining conditions, and be able to select by soft keys. Furthermore, if having a function of automatically replacing with alternative laser machining conditions, it is possible to allow the laser machining to be concluded without stopping, even without a person intervening. In the case of automatically replacing with alternative laser machining conditions, it may be configured not to require displaying the alternative laser machining conditions on the display unit 7, and to simply record in the recording part 10.

In addition, in the laser device 1, it is desirable for the control unit 11, following a predetermined set schedule, to output commands to the power supply unit 4 so as to supply at least one of current or voltage of a predetermined value to the laser oscillator 3, as well as receive the power data supplied from the power supply unit 4 to the laser oscillator 3, and optical output data from the output light detection part 5, and then to update the optical output characteristics of the laser device 1 representing the characteristics of laser beam output relative to the current or voltage supplied from the power supply unit 4, or the heat generation characteristics of the laser oscillator 3 representing the heat generation amount of the laser oscillator 3 relative to the current or voltage supplied from the power supply unit 4, which are recorded in the recording part 10.

In the case of the characteristics of the laser oscillator 3 changing, and the laser oscillator 3 having deteriorated, by updating the optical output characteristics of the laser device 1, for the laser beam output command to the laser device 1, it is made possible to output the appropriate power supply command to the power supply unit 4, and thus possible to output optical output in accordance with the command. Similarly, in the case of the characteristics of the laser oscillator 3 changing or the like, by updating the heat generation characteristics of the laser oscillator 3, for the laser beam output command to the laser device 1, it is made possible to calculate an accurate heat generation amount of the laser oscillator 3, and thus possible to accurately determine whether there is a possibility of the temperature rise of the coolant or component for which the temperature rises by the heat generation from the laser oscillator 3, etc. exceeding predetermined respectively allowed temperatures. In the case of providing a plurality of the laser oscillators 3 as mentioned previously, the optical output characteristics or heat generation characteristics of each laser oscillator 3 can be measured simultaneously by providing at least one of the light detection parts 5 to each laser oscillator 3.

In addition, in the laser device 1, among the temperature detection parts 6, at least one temperature detection part 6 is a temperature detection part 6 that detects the temperature of the environment in which at least one among the laser device 1 and chiller 2 is installed, at least one set of data among environmental temperature dependency data of the cooling capacity of the chiller 2 and environmental temperature dependency data of the heat quantity infiltrating from outside to the cooled part of the laser device 1 is recorded in the recording part 10, and the control unit 11 may determine whether there is a possibility of the temperature rise of the coolant or the component for which the temperature rises by the heat generation from the laser oscillator 3, etc. exceeding the predetermined respective allowed temperatures at the laser machining conditions inputted or set, by referencing the results calculated by the calculation part 9 using the at least one set of data among the data of the cooling capacity of the chiller 2 and the data of the heat quantity infiltrating from outside to the cooled part for the environmental temperature detected by the temperature detection part 6.

The temperature rise of coolant or components such as the laser oscillator 3 exceeding the predetermined respective allowed temperatures contrary to the estimation due to the environmental temperature being high is prevented, by determining whether there is a possibility of the temperature rise of the component such as the laser oscillator 3 or the coolant exceeding the predetermined respective allowed temperatures, in consideration of a change in the cooling capacity of the chiller 2, or change in the heat quantity infiltrating from outside to the cooled part of the laser device 1 depending on the environmental temperature changing. In addition, it is possible to also prevent the chiller 2 not being able to be reduced in size much due to ensuring excess margin in the cooling capacity of the chiller 2 in fear of the occurrence of a situation in which the temperature rise of coolant or a component such as the laser oscillator 3 exceeding the predetermined respective allowed temperatures contrary to the estimation due to the environmental temperature being high. It should be noted that a concrete example of the calculations performed in the calculation part 9 will be described later.

In addition, it is desirable for the laser device 1 to have a function of stopping laser oscillation or decreasing the laser beam output according to a command from the control unit 11, in the case of the temperature rise of coolant or the component for which the temperature rises by heat generation from the laser oscillator 3, etc. exceeding the predetermined respective allowed temperatures.

In the case of the temperature of the coolant or a component for which the temperature rises such as the laser oscillator 3 rising higher than expected at the moment of inputting or setting the laser machining conditions prior to starting laser machining by the trouble of the chiller 2, or the suddenly rising of the environmental temperature during machining, and exceeding the predetermined respective allowed temperatures, by leaving the function of stopping laser oscillation or decreasing laser beam output, it is possible to avoid damage, etc. to the laser oscillator 3.

In addition, for the laser machining conditions input from the input unit 8 or set, in the case of the control unit 11 determining that there is a possibility of the temperature rise of the coolant or the component for which the temperature rises by the heat generation from the laser oscillator 3, etc. exceeding the predetermined respective allowed temperatures by referencing the calculation results of the calculation part 9, it is desirable for the laser device 1 to have a function of displaying a specification of the chiller 2 required in order to machine without changing the laser machining conditions on the display unit 7, or a function of recording the specification in the recording part 10, by referencing the results of calculation commanded by the control unit 11 to the calculation part 9, according to a request inputted from the input unit 8 or a setting.

By having a function of displaying or recording the specification of the chiller 2 required in order to machine at the laser machining conditions as is without changing, in the case of the normally applied machining conditions changing, or the necessity for considering to replace or enlarge the chiller 2 arising for any situation, it is possible to immediately understand what cooling capacity and tank volume equipped chiller 2 would best be established. As mentioned previously, in the case of executing the laser machining by automatically replacing with alternative laser machining conditions, it is sufficient to record the specification of the required chiller 2 and read out when necessary, without requiring to display on the display unit 7.

The recording part 10 at least prepares a region recording the following data (1) to (11).
(1) Cooling capacity of chiller 2 (P described later)
(2) Tank volume of chiller 2
(3) Heat generation amount from laser oscillator 3, etc. ($Q_1$ described later)
(4) Heat capacity of cooled part of laser device 1 to be effectively cooled by coolant ($H_o$ described later)
(5) Optical output characteristics of laser device 1 representing characteristics of laser beam output relative to current or voltage supplied from power supply unit 4
(6) Heat generating characteristics of laser oscillator 3 representing the heat generation amount of the laser oscillator 3 relative to current or voltage supplied from the power supply unit 4
(7) Environmental temperature dependency data of cooling capacity (P) of chiller 2
(8) Environmental temperature dependency data of heat quantity infiltrating from outside to cooled part of laser device 1 ($Q_{1c}(T'_i, T_c)$)
(9) Computational expression for calculating heating value ($Q_1$) from laser oscillator 3, etc. according to laser machining conditions
(10) Computational expression calculating temperature rise of coolant or component for which the temperature rises by heat generation from the laser oscillator 3, etc. (Eq. (3), Eq. (4), Eq. (8) described later)
(11) Data indicating relationship between temperature of cooled portion of laser oscillator 3 and optical output characteristics of laser device 1, and/or data indicating the relationship between temperature of the coolant and optical output characteristics of laser device 1

The matter of recording the computational expressions of items (9) and (10) in the recording part 10 corresponds to the seventh aspect of the invention.

Figure 2:
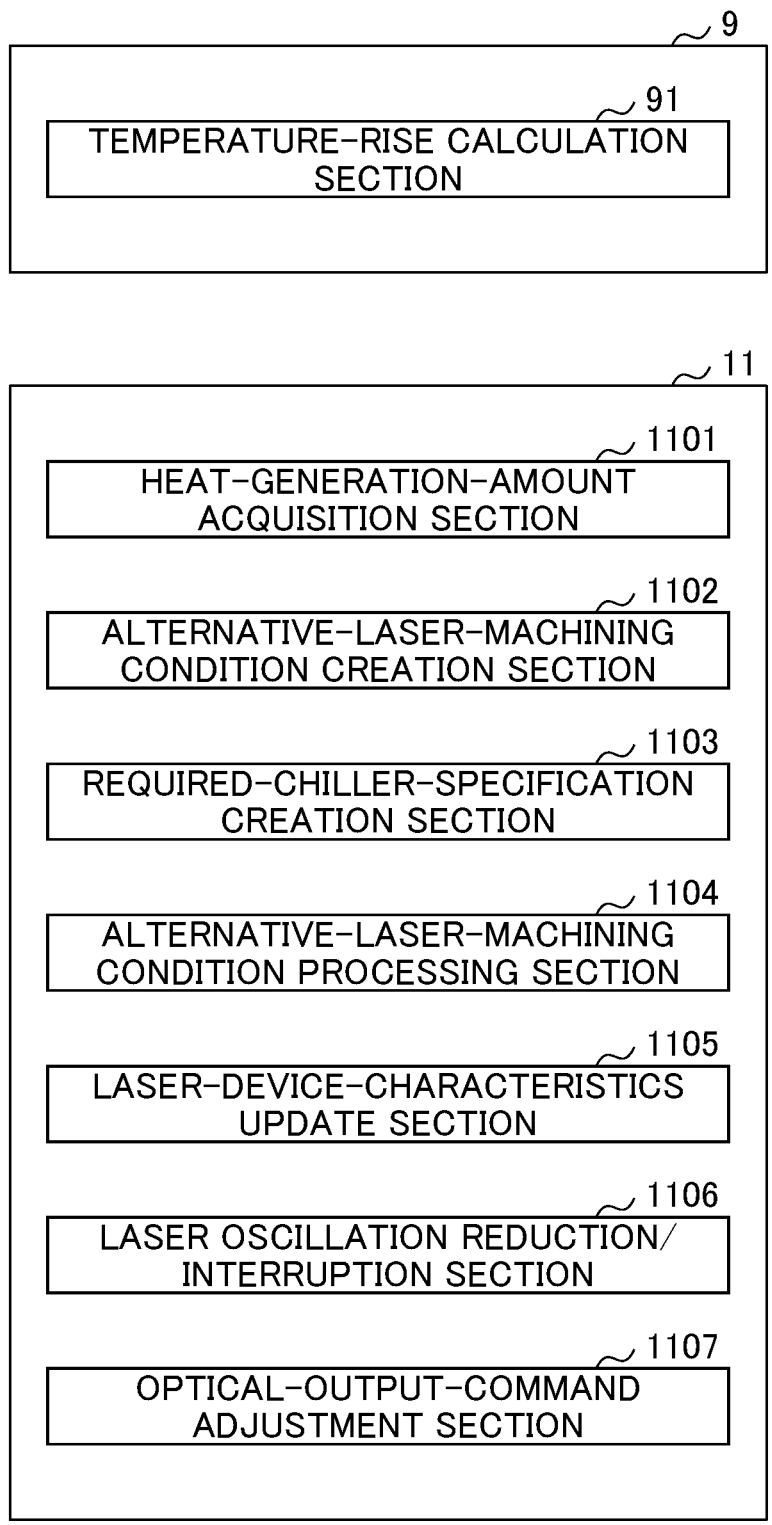
FIG. 2 is a functional block diagram of a calculation part and control part of the laser device according to the first embodiment.

FIG. 2 is a functional block diagram of the calculation part 9 and control unit 11. The calculation part 9 includes a temperature-rise calculation section 91. The temperature-rise calculation section 91 calculates (8) or (9) from the following (1) to (7) using computation expression recorded in the recording part 10.
(1) cooling capacity of chiller 2 (P)
(2) tank volume of chiller 2
(3) heat generation amount from laser oscillator 3, etc. ($Q_1$)
(4) heat capacity of cooled part of laser device 1 effectively cooled by coolant ($H_o$)
(5) temperature of each part ($T_s$ described later)
(6) laser machining conditions including at least one set of output command data among the optical output command data to the laser oscillator 3 and the power output command data to the power supply unit 4
(7) heating value infiltrating from outside ($Q_{1c}(T'_i, T_c)$)
(8) continuous machining allowable time ($t_{max}$ described later)
(9) maximum temperature reached of component or coolant However, regarding the heating value ($Q_{1c}(T'_i, T_c)$) infiltrating from outside in item (7), in the case of this being small compared to the heat generation amount ($Q_1$) from the laser oscillator 3, etc. of item (3) and being able to ignore, it is possible to calculate by ignoring.

The control unit 11 includes a heat-generation-amount acquisition section 1101, alternative-laser-machining-condition creation section 1102, required-chiller specification creation section 1103, alternative-laser-machining-condition processing section 1104, laser-device-characteristics update section 1105, laser-oscillation reduction/interruption section 1106, and optical-output-command adjustment section 1107. Hereinafter, the functions of each of these parts will be explained.

The heat-generation-amount acquisition section 1101 acquires the heat generation amount of the laser oscillator 3 from the current or voltage supplied from the power supply unit 4, by referencing the heat generation characteristics of the laser oscillator 3 recorded in the recording part 10.

The alternative-laser-machining-condition creation section 1102 creates laser machining conditions such that the maximum temperature reached of the component or coolant does not exceed the predetermined allowed maximum temperature, by changing the laser machining conditions such as shortening the time of continuously outputting a laser beam, or lengthening the time of stopping output of a laser beam. The created laser machining conditions are referred to as "alternative laser machining conditions". It is confirmed using the temperature-rise calculation section 91 that the maximum temperature reached of the component or coolant does not exceed the predetermined allowed maximum temperature so long as machining at the alternative laser machining conditions.

The required-chiller specification creation section 1103 creates the specification of the chiller such that the maximum temperature reached of the component or coolant does not exceed the predetermined allowed maximum temperature, without changing the laser machining conditions, by way of raising the cooling capacity of the chiller 2, increasing the tank volume of the chiller 2, or the like. This created chiller specification is referred to as "required chiller specification". It is confirmed using the temperature-rise calculation section 91 that the maximum temperature reached of the component or coolant does not exceed the predetermined allowed maximum temperature, even without changing the machining conditions, so long as using a chiller satisfying the required chiller specification.

In the case of machining at the laser machining conditions inputted through the input unit 8 or set, and in the case of determining that there is a possibility of the temperature rise of the coolant or the component for which the temperature rises by the heat generation from the laser oscillator 3, etc. exceeding the predetermined respective allowed temperature, the alternative-laser-machining-condition processing section 1104 displays the alternative laser machining conditions created by the alternative-laser-machining-condition creation section 1102 on the display unit 7, and/or records the alternative laser machining conditions in the recording part 10, and/or automatically replaces the inputted or set laser machining conditions with the alternative laser machining conditions.

The laser-device-characteristics update section 1105 receives power data supplied from the power supply unit 4 to the laser oscillator 3 and optical output data from the output light detection part 5, measures the optical output characteristics of the laser device 1 and the heat generation characteristics of the laser oscillator 3, and updates at least one set of characteristics among the optical output characteristics of the laser device 1 representing the characteristics of the laser beam output relative to the current or voltage supplied from the power supply unit 4, and the heat generation characteristics of the laser oscillator 3 representing the heat generation amount of the laser oscillator 3 relative to the current or voltage supplied from the power supply unit 4, which are recorded in the recording part 10.

The laser-oscillation reduction/interruption section 1106 causes laser oscillation to stop or causes laser beam output to decrease, in the case of the temperature rise of the component or coolant detected by the temperature detection part 6 exceeding the respective allowed temperature.

The optical-output-command adjustment section 1107 adjusts the optical output command so that the laser output is stable, in response to a change in the temperature of the coolant or the component for which the temperature rises by the heat generation from the laser oscillator 3, etc., by referencing the data indicating the relationship between the optical output characteristics of the laser device 1 and at least one temperature among the temperature of the cooled portion of the laser oscillator 3 and the temperature of coolant, which is recorded in the recording part 10.

Figure 3A:
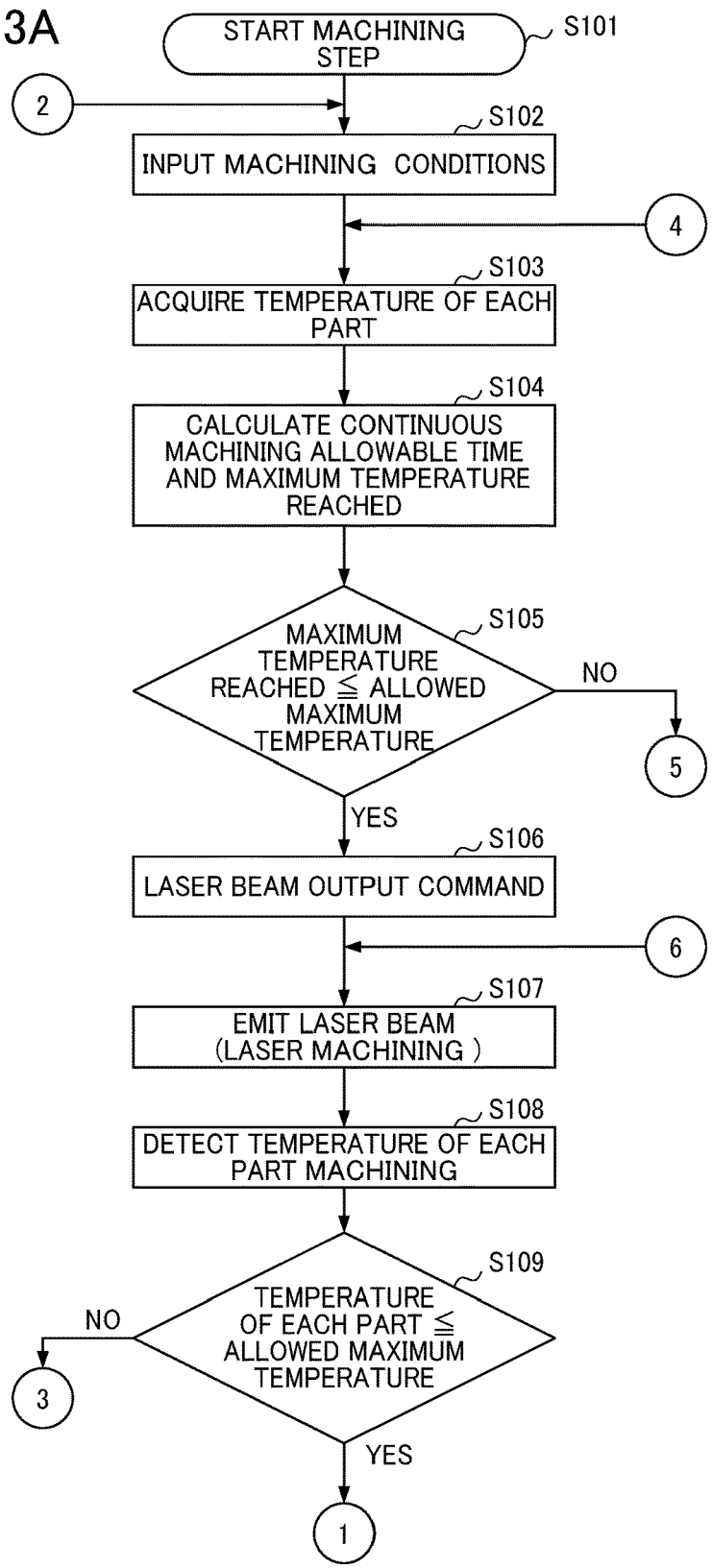
FIG. 3A is a flowchart showing an example of operations of the laser device according to the first embodiment.
Figure 3B:
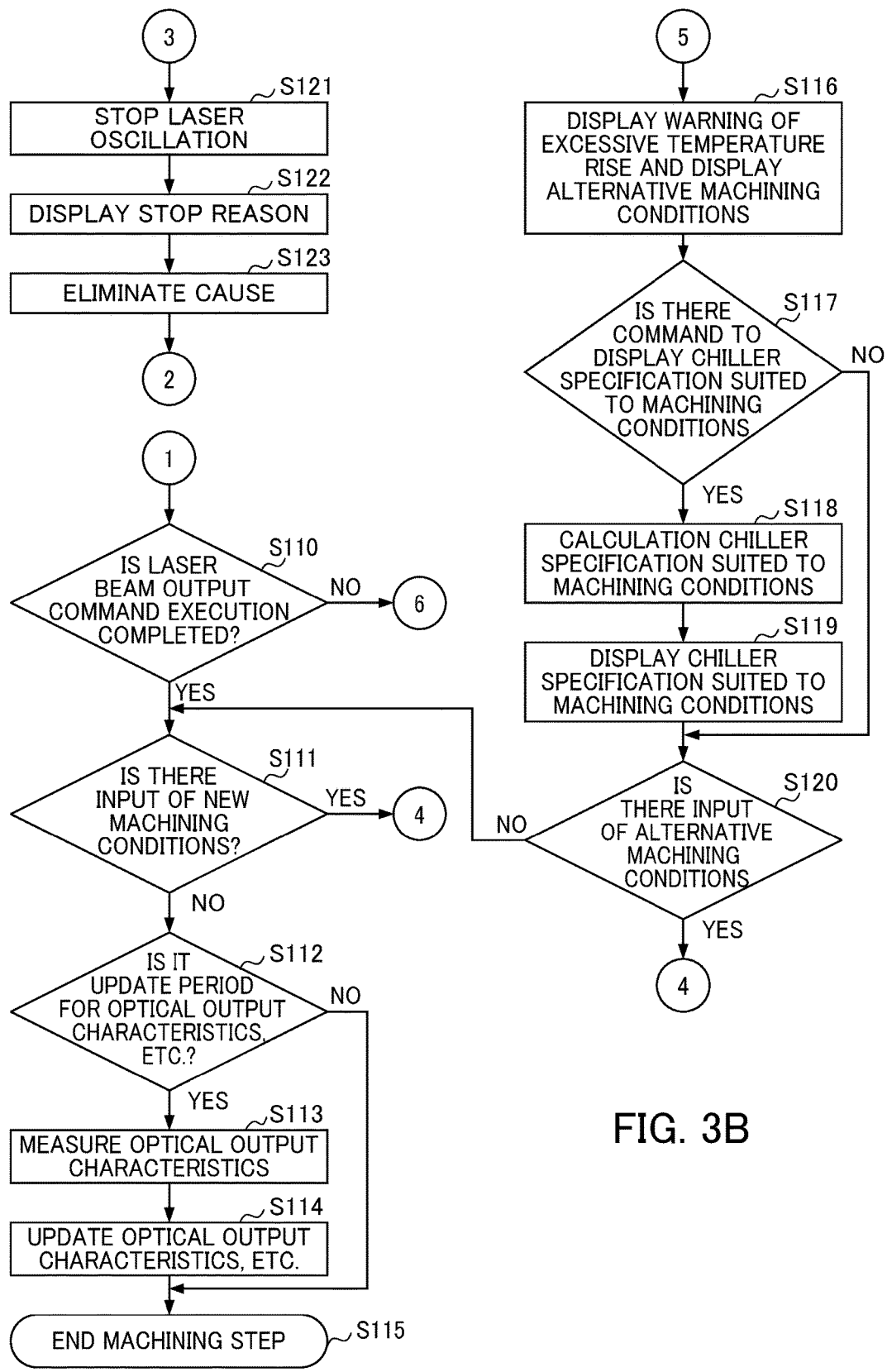
FIG. 3B is a flowchart showing an example of operations of the laser device according to the first embodiment.

Herein, an example of a series of operations of the laser device 1 will be explained. FIG. 3A and FIG. 3B are a flowchart showing an example of operations of the laser device 1 shown in FIG. 1. In Step S101, the laser device 1 is activated, and then the workpiece is set to start a laser machining step. In Step S102, the laser machining conditions which include at least one set of output command data among optical output command data to the laser oscillator 3 and power output command data to the power supply unit 4 are set by inputting from the input unit 8.

In Step S103, the temperature detection part 6 installed to each part such as the laser oscillator 3 and coolant acquires the temperature data of each part according to a command of the control unit 11. In Step S104, the temperature rise calculation section 91 calculates the continuous machining allowable time ($t_{max}$) or maximum temperature reached of each part from computational expressions, based on the temperature of each part ($T_s$), laser machining conditions, cooling capacity (P) of the chiller and tank volume of the chiller, heat generation amount ($Q_1$) from the laser oscillator, etc., and heat capacity ($H_o$) of the cooled part of the laser device to be effectively cooled by the coolant, etc., recorded in the recording part 10. In Step S105, it is determined whether the maximum temperature reached of each part is lower than the maximum allowed temperature of each part. In the case of this determination being YES, the processing advances to Step S106, and in the case of the determination being NO, the processing advances to Step S116.

In Step S106, the control unit 11 generates a laser beam output command. In Step S107, the laser device 1 emits a laser beam and performs laser machining. In Step S108, the temperature detection parts 6 detect the temperature of each part constantly during the laser machining.

In Step S109, it is determined whether the temperature of each part ($T_s$) thus detected is lower than the predetermined respective allowed maximum temperatures. In the case of this determination being YES, the processing advances to Step S110, and in the case of the determination being NO, the processing advances to Step S121. In Step S110, it is determined if the execution of the laser beam output command has completed. In the case of this determination being YES, the processing advances to Step S111, and in the case of the determination being NO, the processing advances to Step S107.

In Step S111, it is determined whether there is input of new laser conditions. In the case of this determination being YES, the processing advances to Step S103, and in the case of the determination being NO, the processing advances to Step S112. In Step S111, in the case of there being input of new laser machining conditions, a cycle of returning to Step S103, and progressing again to the determination of whether the temperature of each part has not become a higher temperature than the predetermined respective allowed maximum temperatures is repeated.

In Step S112, it is determined whether it is an update period of the optical output characteristics or heat generation characteristics of the laser oscillator 3 following a predetermined schedule. In the case of this determination being YES, the processing advances to Step S113, and in the case of the determination being NO, the processing advances to Step S115.

The processing performed in Steps S113 and S114 correspond to the third aspect of the invention. In Step S113, the laser-device-characteristics update section 1105 measures the optical output characteristics of the laser device 1 and heat generation characteristics of the laser oscillator 3. In Step S114, the laser-device-characteristics update section 1105 updates the optical output characteristics of the laser device 1 and the heat generation characteristics of the laser oscillator 3 recorded in the recording part 10. In Step S115, the laser machining step is ended, and operations for removal of the workpiece and stopping the laser device are performed.

In the processing performed in Step S116, the processing of displaying a warning corresponds to the first aspect of the invention, and the processing of displaying alternative laser machining conditions corresponds to a case of displaying the alternative laser machining conditions on the display unit of the second aspect of the invention. In Step S116, the alternative-laser-machining-condition creation section 1102 creates alternative laser machining conditions, and the alternative-laser-machining-condition processing section 1104 displays a warning such as "possibility for temperature of laser oscillator to exceed allowed maximum temperature at the set laser machining conditions", and displays on the display unit 7 the alternative laser machining conditions such as "please set the continuous machining time to no longer than 5 minutes, or start machining 3 minutes after temperature of coolant drops."

In Step S117, it is determined whether a command to display what specification of chiller is required to machine without changing the set laser machining conditions has been inputted by soft keys displayed on the display unit or the like. In the case of this determination being YES, the processing advances to Step S118, and in the case of the determination being NO, the processing advances to Step S120.

The processing performed in Steps S118 and S119 correspond to the sixth aspect of the invention. In Step S118, the required-chiller specification creation section 1103 calculates the required chiller specification for the temperature of each part not to exceed the predetermined respective allowed maximum temperatures by executing as is without changing the laser machining conditions that were originally set. In Step S119, the specification of the chiller suited to the conditions performing the laser machining at the laser machining conditions originally set are displayed on the display unit 7.

In Step S120, it is determined if alternative laser machining conditions have been inputted or selected. In the case of this determination being YES, the processing advances to Step S103, and in the case of the determination being NO, the processing advances to Step S111. In the case of alternative laser machining conditions having been inputted or selected, a cycle of returning to Step S103, and progressing again to the determination of whether the temperature of each part has not become a higher temperature than the predetermined respective allowed maximum temperatures is repeated.

The processing performed in Step S121 corresponds to the fifth aspect of the invention. In Step S121, the laser-oscillation reduction/interruption section 1106 conducts warning emergency processing to stop the laser oscillator or cause the optical output to decrease, in order to avoid damage to the laser oscillator, etc. In Step S122, a stop reason such as "laser oscillator stopped due to temperature of laser oscillator exceeding allowed maximum temperature" is displayed on the display unit. In Step S123, since a cause such as failure of the chiller is considered, the cause is investigated and the cause is eliminated. Subsequently, the processing returns to Step S102, and restarts the laser machining.

By way of the operations of the above Steps S101 to S123, even if selecting a small-sized chiller that is low cost and has a small occupying space, unless an unexpected situation arises such as failure of the chiller 2, it is possible to resolve the problem in that a workpiece becomes inferior during machining due to the heat generating part such as the laser oscillator 3 or the coolant excessively rising in temperature during laser machining is detected, and the laser oscillation being stopped or the laser beam output being decreased, since a warning is emitted at the stage of setting the laser machining conditions, prior to starting the laser machining, in the case of there being a possibility of the temperature of the laser oscillator 3 or coolant exceeding the predetermined respective allowed temperatures, according to the calculation results of the temperature-rise calculation section 91.

In addition, also in the case of there being a possibility of the temperature rise of the coolant or component for which the temperature rises by the heat generation from the laser oscillator 3, etc. exceeding the predetermined respective allowed temperatures, since the alternative laser machining conditions created by the alternative-laser-machining-condition creation section 1102 are displayed, the problem in that the target machining is not possible can be avoided by resetting to the displayed alternative laser machining conditions. Furthermore, since the required-chiller specification creation section 1103 creates the required chiller specification, in the case of the type, etc. of workpiece that is the target of laser machining greatly changing, or the necessity arising to consider replacement of the chiller 2, it is possible to immediately notice with what cooling capacity and tank volume equipped chiller would be best to replace.

In addition, also in the case of the temperature of the coolant or component for which the temperature rises such as the laser oscillator 3 rising, and exceeding the predetermined respective allowed temperatures, contrary to expectation due to failure of the chiller 2 or the like, it is possible to avoid damage or the like to the laser oscillator by stopping laser oscillation or decreasing the laser output by way of the laser-oscillation reduction/interruption section 1106.

Furthermore, in the case of the characteristics of the laser oscillator 3 changing, it is possible to output an optical output in accordance with the command by updating the optical output characteristics of the laser device 1 by way of the laser-device-characteristics update section 1105, and it is possible accurately determine whether there is a possibility of the temperature rise of the coolant or component for which the temperature rises by the heat generation from the laser oscillator 3, etc. exceeding the predetermined respective allowed temperatures, by updating the heat generation characteristics of the laser oscillator 3.

In addition, in order for the temperature-rise calculation section 91 to calculate whether there is a possibility of the temperature rise of the coolant or component for which the temperature rises by the heat generation from the laser oscillator 3, etc. exceeding the predetermined respective allowed temperatures at the set laser machining conditions, from the cooling capacity (P) of the chiller 2 and tank volume of the chiller 2, the heat generation amount ($Q_1$) from the laser oscillator 3, etc. and heat capacity ($H_o$) of the cooled part of the laser device 1 to be effectively cooled by coolant, in accordance with a command of the control unit 11, the laser device 1 can record, in the recording part 10, an computational expressions for calculating the heat generation amount from the laser oscillator 3, etc. according to the laser machining conditions, and computational expressions that calculate the temperature rise of the coolant and component for which the temperature rises by the heat generation from the laser oscillator 3, etc. (Eq. (3), Eq. (4), Eq. (8) described later), in addition to recording at least the cooling capacity (P) of the chiller 2, and tank volume of the chiller 2, and the heat capacity ($H_o$) of the cooled part of the laser device to be effectively cooled by the coolant. It is possible to easily calculate the temperature rise of the component or coolant by recording computational expressions in the recording part 10, in addition to numerical information required in calculation.

Figure 4:
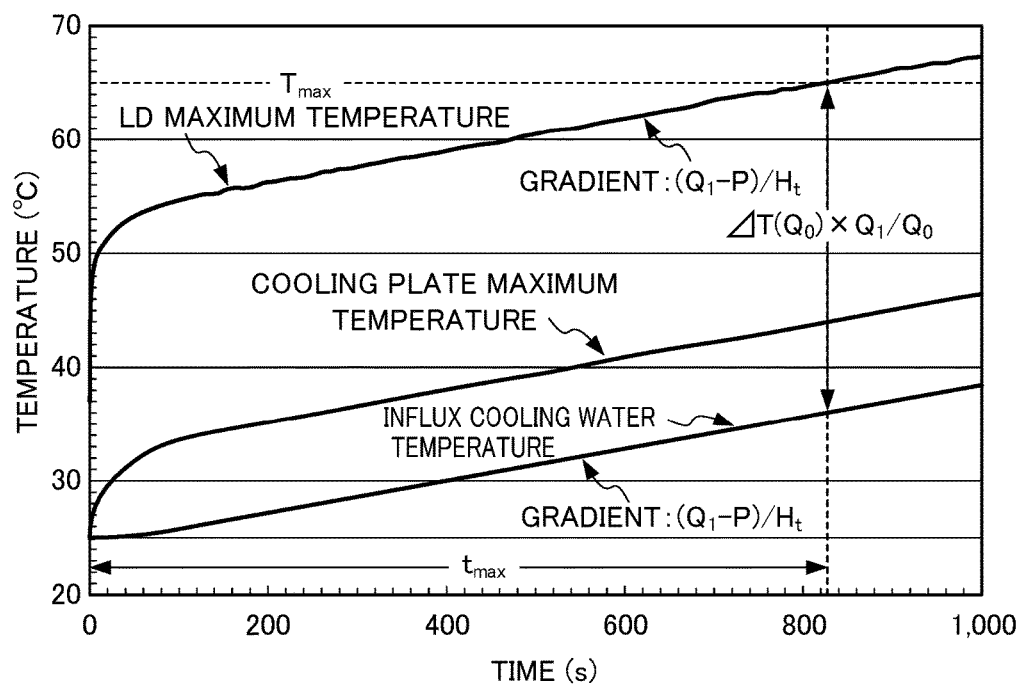
FIG. 4 is a graph showing an example of the temperature change of each part of the laser device due to heat generation accompanying continuous laser beam output of the laser device according to the first embodiment.

Herein, the specific computational expressions will be mentioned. Although not limiting the type of laser oscillator 3, a case of using a laser diode (LD) as the laser beam source or excitation light source will be described herein. FIG. 4 shows an example of the time change of the maximum temperature of LD, (maximum) temperature of a cooling plate that cools the LD, and temperature of coolant flowing to the cooling plate, when starting the output of a laser beam at certain laser machining conditions. When excluding the period of initial startup, the slopes of the above-mentioned three temperatures relative to time match. Then, this slope, i.e. rising rate of temperature ($v_{up}$), is represented by Eq. (1) described below.

[math. 01]

$$v_{up} = (Q_1 - P)/H_t \qquad \text{Equation (1)}$$

Herein,
$Q_1$=average heat generation amount (W) under set laser beam output conditions,
P=cooling capacity of chiller (W), and
$H_t$=total heat capacity (J/K)=heat capacity of coolant ($H_w$)+heat capacity of cooled part ($H_o$).

What is referred to as average heat generation amount indicates being applied at an averaged heat generation amount per time in the case of the laser oscillation being pulse oscillation, and the average heat generation amount of the laser oscillator 3 is normally given by a value arrived at by multiplying the duty of the pulse by the heat generation amount during peak optical output. It should be noted that, in the case of cooling other components than the laser oscillator 3 such as the power supply unit 4 with coolant, it is necessary to add the heat generation amount of the other cooled parts to the heat generation amount of the laser oscillator 3.

The heat capacity of the coolant ($H_w$) is given by multiplying the volume, density and specific heat of the coolant accommodated in the tank 15 of the chiller and the coolant pipes 13, and the heat capacity of the cooled part ($H_o$) is constant in the laser oscillator 3 of the same structure, and can be obtained from thermo-fluid analysis or measurement. Equation (1) expresses the phenomenon of the temperature rising at the speed of heating value/heat capacity, when giving the heating value ($Q_1$-P) relative to the heat capacity $H_t$.

In addition, when excluding the period of initial startup, the difference between the LD maximum temperature and temperature of influx coolant to the cooling plate ($\Delta T(Q_1)$) is constant, and in the case of the heat source only being LD, is expressed by Eq. (2) noted below. In the case of there being a heat source other than LD, it is necessary to use the heat generation amount of LD arrived at by subtracting the heat generation amount of the heat source other than LD in $Q_1$ and $Q_0$ used in the calculation of $\Delta T(Q_1)$.

[math. 02]

$$\Delta T(Q_1) = \Delta T(Q_0) \times Q_1/Q_0 \quad \text{Equation (2)}$$

Herein, $\Delta T(Q_0)$=temperature difference between LD maximum temperature during maximum rated optical output and influx coolant, and $Q_0$=heat generation amount during maximum rated output (W). Equation (2) expresses the phenomenon in that the temperature difference $\Delta T$ ($Q_1$) between both is proportional to the heat quantity $Q_1$ flowing from LD to the coolant, when the thermal resistance from LD to coolant is decided. It should be noted that "delta" in Eqs. (2) to (8) has the same meaning as "$\Delta$".

Equation (3) noted below can be derived from Eq. (1) and Eq. (2) noted above.

[math.03]

$$t_{max} = \frac{T_{max} - \Delta T(Q_0) \times Q_1/Q_0 - T_s}{(Q_1 - P)/H_i} \quad \text{Equation (3)}$$

Herein, $t_{max}$=continuous machining allowable time (s), $T_{max}$=LD allowed maximum temperature (degrees), and $T_s$=temperature of coolant at machining start (degrees).

$\Delta T(Q_0)$ is constant in the laser oscillators 3 of the same structure, and it is possible to obtain by thermo-fluid analysis or measurement; therefore, if the heat generation amount ($Q_1$) at the laser beam output conditions included in the laser machining conditions is known, it is possible to calculate until what degree the temperature of LD will rise at the set laser machining conditions from Eq. (3). For example, in the example of FIG. 4, $T_{max}$=65.4° C. and $T_s$=25° C., and $\Delta T(Q_0)$=36.3° C., $Q_0$=2,518 W, $Q_1$=2,014 W, P=604 W, $H_w$=84,500 J/K, and $H_o$=14,700 J/K, and thus the continuous machining allowable time calculated by Eq. (3) is $t_{max}$=800 s. Conversely, if substituting an arbitrary time into $t_{max}$, and calculating $T_{max}$, it is possible to calculate to what degree the temperature of LD will rise at this arbitrary time.

However, the above-mentioned calculated value $t_{max}$=800 s is somewhat shorter than the $t_{max}$=825 s shown in FIG. 4. This is because the rise in temperature of the coolant is slow at the initial startup period. In a physical sense, the temperature of the heat path from LD to the coolant is low, and a temperature gradient decided from the thermal resistance of the heat path and the heat quantity passing therethrough is not formed, and thus the heat quantity is used in order to raise the temperature of this heat path; therefore, the thinking in that the rise in coolant temperature is slow is considered. Therefore, although Eq. (3) may be used by considering this extent of difference as margin, Eq. (4) written by adding the time until having the temperature gradient deciding the temperature of the heat path from LD to the coolant based on the thermal resistance and passing heat quantity may be used in place of Eq. (3).

[math 04]

$$t_{max} = \frac{T_{max} - \Delta T(Q_0) \times Q_1/Q_0 - T_s}{(Q_1 - P)/H_i} + \frac{k \times \Delta T(Q_0) \times Q_1/Q_0 \times H_o}{Q_1 - P} \quad \text{Equation (4)}$$

Herein, k is a coefficient, and due to being temperature rise of a part of the cooled part by the coolant, k is less than 1. In the case of the laser device 1 in FIG. 1, there is almost none of the above-mentioned difference when setting k=0.08.

Observing the temperature of each part including the coolant temperature in the above way, based on the cooling capacity (P) of the chiller, the heat capacity ($H_w$) of the coolant, the heat capacity ($H_o$) of the cooled part, the temperature difference $\Delta T$ ($Q_0$) between the influx coolant and the LD maximum temperature during maximum rated optical output, heat generation amount ($Q_0$) during maximum rated output, allowed maximum temperature ($T_{max}$) of LD, heat generation amount ($Q_1$) during optical output command execution corresponding to the set laser machining conditions, and at least one computational expression among Eq. (3) and Eq. (4), the temperature-rise calculation section 91 calculates the LD temperature in the case of executing laser machining conditions that were inputted or set, and in the case of estimating that the LD temperature will exceed the predetermined allowed maximum temperature $T_{max}$, can display a warning. In addition, it is possible to display alternative laser machining conditions at which the LD temperature will not exceed the predetermined allowed maximum temperature $T_{max}$, by way of the alternative-laser-machining-condition creation section 1102 and the alternative-laser-machining-condition processing section 1104. Furthermore, it is possible to display with what specification chiller it is best to reconstruct or replace, in order to execute the laser machining conditions as inputted or set without the LD temperature exceeding the predetermined allowed maximum temperature $T_{max}$, by way of the required-chiller specification creation section 1103.

Figure 5:
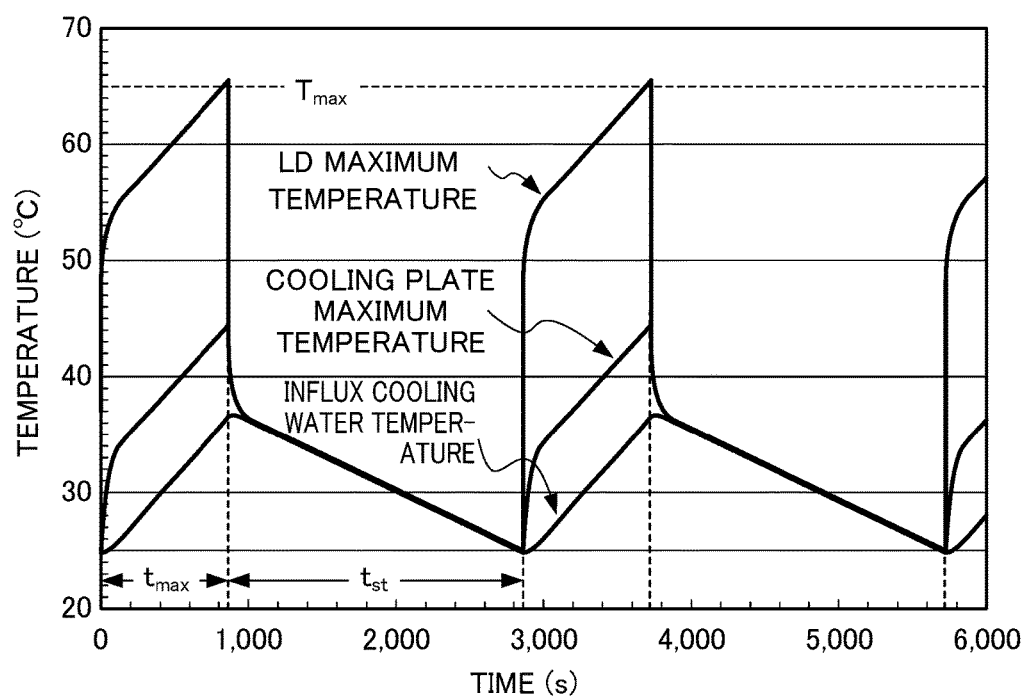
FIG. 5 is a graph showing an example of the temperature change of each part of the laser device due to heat generation accompanying intermittent laser beam output of the laser device according to the first embodiment.

Next, the limitations in the case of repeatedly performing laser machining will be mentioned. As shown in FIG. 4, if the temperature of coolant rises, the laser beam output is no longer possible, and it is necessary to wait for the temperature of coolant to decline. FIG. 5 shows an aspect of outputting a laser beam continuously for about 825 seconds, stopping the laser beam output from the moment when the temperature of LD reached the allowed maximum temperature $T_{max}$=65.4° C., and the temperature of the coolant declining, by setting the same heat generation amount ($Q_1$) in the laser device 1 as the laser device 1 for which the data of FIG. 4 was acquired. The lowering speed ($v_{down}$) of the coolant temperature is represented by Eq. (5) noted below.

[math 05]

$$v_{down} = P/H_t \quad \text{Equation (5)}$$

Therefore, Eq. (6) holds true, and Eq. (7) can be derived from Eq. (6).

[math 06]

$$t_{st}/t_{max} = (Q_1 - P)/P \qquad \text{Equation (6)}$$

[math 07]

$$t_{max}/(t_{max} + t_{st}) = P/Q_1 \qquad \text{Equation (7)}$$

Herein, $t_{st}$ is the time required from after stopping the laser beam output until the temperature of the coolant drops to the original temperature prior to starting laser beam output, as shown in FIG. 5. As is evident from. FIG. 5, when the coolant temperature returns to the original temperature, in the case of starting laser beam output again so as to be the same as the previous time from this moment, the temperature of LD and coolant will change in the same way as the previous time. In this way, the change in temperatures of LD and coolant can be predicted by way of calculation for during both temperature rise and temperature drop. Equation (7) expresses the ratio (long cycle duty) of time performing laser beam output, as is evident from FIG. 5. As is evident from Eq. (7), the upper limit of the long cycle duty is decided according to the cooling capacity of the chiller and the heat generation amount during laser beam output, and the LD temperature will eventually exceed the allowed maximum temperature $T_{max}$ if setting laser machining conditions of the long cycle duty surpassing this upper limit.

In this way, in the case of the laser machining conditions including a series of laser beam outputs at which the LD temperature will eventually exceed the allowed maximum temperature $T_{max}$ being set, a warning of excessive temperature rise may be displayed at the moment being set, or laser beam output at which the LD temperature will not exceed the allowed maximum temperature $T_{max}$ among a series of laser beam outputs may be performed, and may be made a setting that displays a warning of excessive temperature rise immediately before the laser beam output at which it is predicted that the LD temperature will exceed the allowed maximum temperature $T_{max}$ if conducting the next laser beam output. In the case of making the setting that displays a warning of excessive temperature rise immediately before the laser beam output at which it is predicted that the LD temperature will exceed the allowed maximum temperature $T_{max}$ if conducting the laser beam output, in Step S110 of the flowchart showing an example of operations of the laser device in FIG. 3B, it may be configured so as to return to Step S103 without returning to Step S107, in the case of determining that execution of the laser beam output command is not completed.

In the case of predicting that the LD temperature will exceed the allowed maximum temperature $T_{max}$ if conducting the laser beam output, if set so as to conduct laser machining by the alternative-laser-machining-condition processing section 1104 replacing the laser machining conditions with the alternative laser machining conditions automatically, it is possible to replace with alternative laser machining conditions such as automatically extending the rest period of laser beam output which is prior to laser beam output, among a series of laser beam outputs, at which it is predicted that the LD temperature will exceed the allowed maximum temperature $T_{max}$ if conducting laser beam output. By way of replacing with such alternative laser machining conditions, it is possible to successfully conclude laser machining even without a person intervening, without causing a problem such as unscheduled and abrupt stopping when the LD temperature exceeds the allowed maximum temperature $T_{max}$ in the middle of outputting a laser beam for laser machining, and then the workpiece becoming a defective product.

According to the first embodiment, the following effects are exerted.

(1) Since a warning of excessive temperature rise is displayed on the display unit 7, or the warning of excessive temperature rise is recorded in the recording part 10 prior to starting laser machining, it is possible to overcome the problem in that the workpiece under machining becomes inferior due to starting laser machining without noticing that there is a possibility of the coolant or heat generating part such as the laser oscillator 3 excessively rising in temperature during laser machining, then detecting that the coolant or heat generating part such as the laser oscillator 3 has excessively risen in temperature, and stopping laser oscillation or decreasing laser beam output.

(2) In the case of there being a possibility of the temperature rise of the coolant or a component for which the temperature rises by heat generation from the laser oscillator 3, etc. exceeding predetermined respective allowed temperatures, since alternative laser machining conditions are displayed, it is possible to avoid a problem in that the target machining is not possible, by resetting to the displayed laser machining conditions.

(3) Since the optical output characteristics of the laser device 1 are updated in the case of the characteristics of the laser oscillator 3 changing, it is possible to output a optical output in accordance with the command, and since the heat generation characteristics of the laser oscillator 3 are updated, it is possible to accurately determine whether there is a possibility of the temperature rise of the coolant or component for which the temperature rises by heat generation from the laser oscillator 3, etc. exceeding the predetermined respective allowed temperatures.

(4) In the case of the temperature rise of the coolant or component for which the temperature rises by heat generation from the laser oscillator 3 exceeding the predetermined respective allowed temperatures, since the laser oscillation will be stopped or the laser beam output will be decreased, it is possible to avoid damage or the like to the laser oscillator 3, even in a case of the temperature of the coolant or component for which the temperature rises such as the laser oscillator 3 excessively rising to exceed the predetermined respective allowed temperatures, contrary to expectation.

(5) In the case of determining that there is a possibility of the temperature rise of a component or coolant exceeding the predetermined respective allowed temperatures, since the specification of the chiller required in order to machine without changing the laser machining conditions will be displayed on the display unit 7, it is possible to immediately notice with what cooling capacity and tank volume equipped chiller would be best to replace, in the case of the necessity arising to consider replacement of the chiller 2.

(6) Since computational expressions are recorded in addition to the numerical information required in calculation in the recording part 10, it is possible to easily calculate the temperature rise of components or coolant.

(Modified Example 1 of First Embodiment)

Figure 6A:
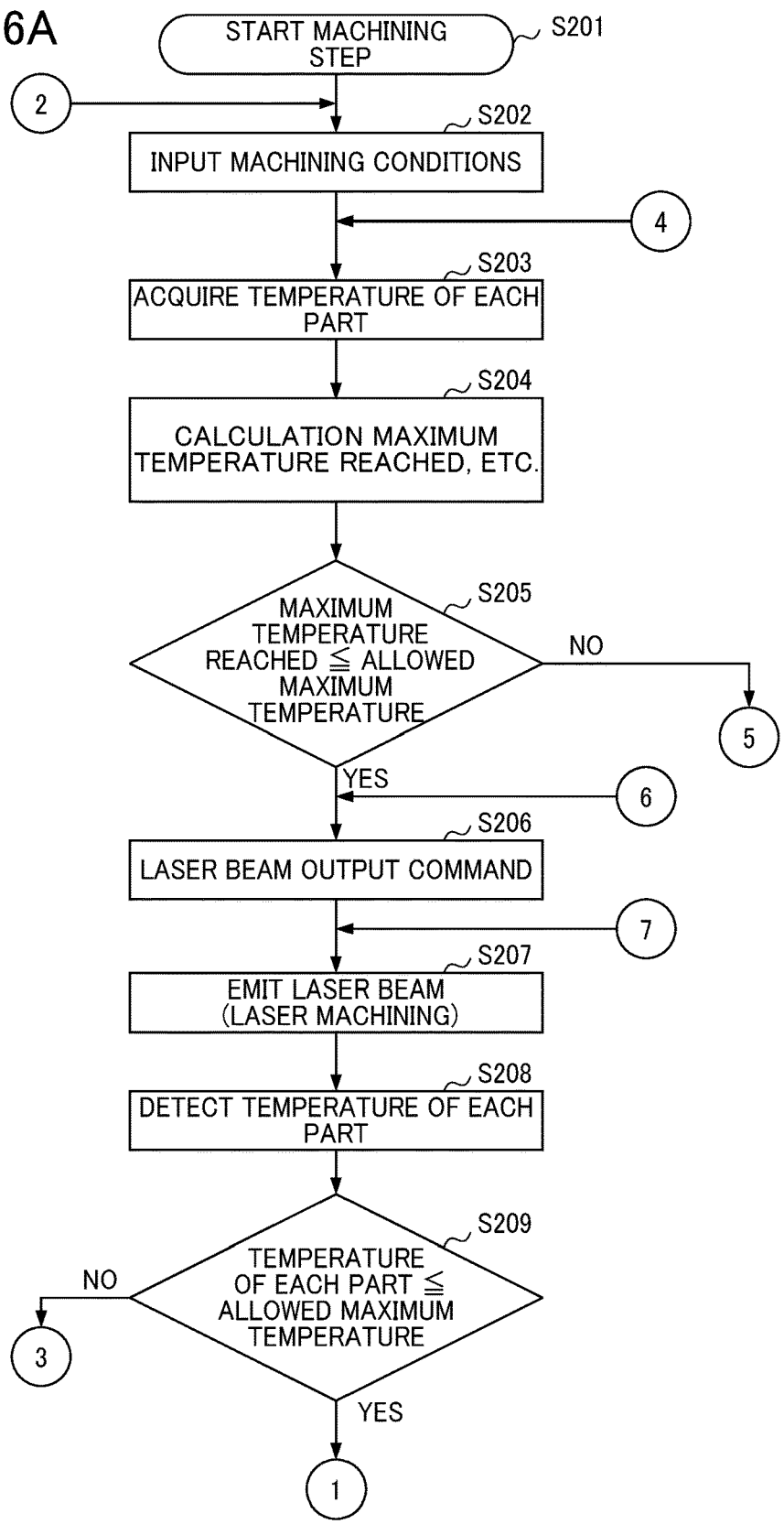
FIG. 6A is a flowchart showing an example of operation of a modified example 1 of the laser device according to the first embodiment.
Figure 6B:
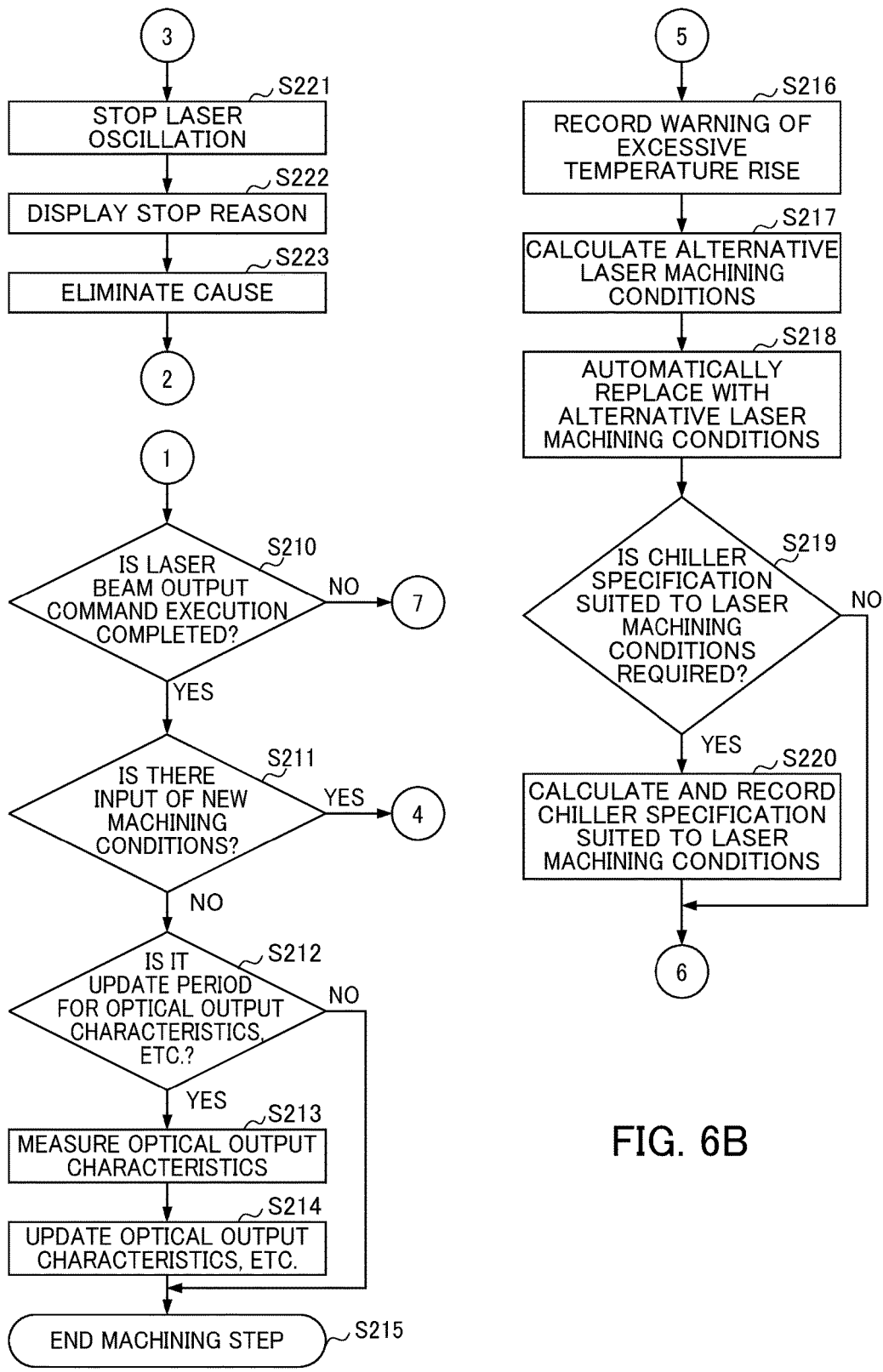
FIG. 6B is a flowchart showing an example of operation of a modified example 1 of the laser device according to the first embodiment.

Modified Example 1 of the first embodiment corresponds to a case of automatically replacing the laser machining conditions with the alternative laser machining conditions in the second aspect of the invention. The device configuration of Modified Example 1 of the first embodiment is the same as the first embodiment. Modified Example 1 of the first embodiment differs from the first embodiment in the processing in the case of the maximum temperature reached of each part exceeding the allowed maximum temperature of each part in Step S105 of the flowchart of the first embodiment. FIG. 6A and FIG. 6B are a flowchart showing operations in Modified Example 1 of the laser device according to the first embodiment, and shows a flowchart in the case of expecting the LD temperature to exceed the allowed maximum temperature $T_{max}$ when conducting laser machining, and automatically setting so as to conduct laser machining by replacing the laser machining conditions with the alternative laser machining conditions. In Step S201, the laser device shown in FIG. 1 is activated, and then the workpiece is set to start a laser machining step. In Step S202, the laser machining conditions are set by inputting laser machining conditions including at least one set of output command data from among optical output command data to the laser oscillator 3 and power output command data to the power source 4 from the input unit 8.

In Step S203, the temperature detection parts 6 installed at each part such as for the laser oscillator 3 and coolant acquire temperature data of each part according to a command of the control unit 11. In Step S204, the temperature-rise calculation section 91 calculates the maximum temperature reached, etc. of each part from the aforementioned computational expressions, based on the temperature of each part ($T_s$), laser machining conditions, cooling capacity (P) of the chiller 2 and tank volume of the chiller 2, heat generation amount ($Q_1$) from the laser oscillator 3, etc., and heat capacity ($H_o$) of the cooled part of the laser device 1 to be effectively cooled by coolant, etc., recorded in the recording part 10. In Step S205, it is determined whether the maximum temperature reached of each part calculated is lower than the allowed maximum temperature $T_{max}$ of each part. In the case of this determination being YES, the processing advances to Step S206, and in the case of the determination being NO, the processing advances to Step S216.

In Step S206, the control unit 11 issues a laser beam output command. In Step S207, the laser device 1 emits a laser beam, and performs laser machining. In Step S208, the temperature detection parts 6 detect the temperature of each part constantly during the laser machining. In Step S209, it is determined whether the temperature of each part detected will be lower than the predetermined respective allowed maximum temperatures $T_{max}$. In the case of this determination being YES, the processing advances to Step S210, and in the case of the determination being NO, the processing advances to Step S221.

In Step S210, it is determined whether the execution of the laser beam output command has completed. In the case of this determination being YES, the processing advances to Step S211, and in the case of the determination being NO, the processing advances to Step S207. Until determined that the execution of the laser beam output command has completed, while not exceeding the predetermined respective allowed maximum temperatures $T_{max}$, the processing returns to Step S207, and laser machining is continued. In Step S211, it is determined whether there is an input of new laser machining conditions. In the case of this determination being YES, the processing advances to Step S203, and in the case of the determination being NO, the processing advances to Step S212. In the case of there being an input of new laser machining conditions, a cycle of returning to Step S203, and progressing again to the determination of whether the temperature of each part has not become a higher temperature than the predetermined respective allowed maximum temperatures $T_{max}$ according to the new laser machining conditions is repeated.

In Step S212, it is determined whether it is an update period of the optical output characteristics or heat generation characteristics of the laser oscillator 3 following a predetermined schedule. In the case of this determination being YES, the processing advances to Step S213, and in the case of the determination being NO, the processing advances to Step S215. In Step S213, the laser-device-characteristics update section 1105 measures the optical output characteristics of the laser device 1 and the heat generation characteristics of the laser oscillator 3. In Step S214, the laser-device-characteristics update section 1105 updates the optical output characteristics of the laser device 1 and the heat generation characteristics of the laser oscillator 3 recorded in the recording part 10. In Step S215, the laser processing step is ended, and operations for removal of the workpiece and stopping the laser device are performed.

In Step S216, a warning such as there being a possibility of the temperature of the laser oscillator 3 exceeding the allowed maximum temperature $T_{max}$ at the set laser machining conditions is recorded in the recording part 10. In Step S217, the alternative-laser-machining-condition creation section 1102 calculates alternative laser machining conditions using the aforementioned computational expressions, based on the temperature ($T_s$) of each part, cooling capacity (P) of the chiller 2 and tank volume of the chiller 2, the heat generation amount ($Q_1$) from the laser oscillator 3, etc., and heat capacity ($H_o$) of the cooled part of the laser device 1 to be effectively cooled by the coolant, etc., recorded in the recording part 10. In Step S218, the alternative-laser-machining-condition processing section 1104 replaces the set laser machining conditions with the calculated alternative laser machining conditions.

In Step S219, it is determined whether becoming a setting requiring the calculation of a chiller specification suited to the laser machining conditions at which to perform laser machining without changing from the set laser machining conditions is required. In the case of this determination being YES, the processing advances to Step S220, and in the case of this determination being NO, the processing advances to Step S206. In the case of being a setting not requiring chiller specification calculation, the processing advances to Step S206, and executes the laser machining. In Step S220, the required-chiller specification creation section 1103 calculates the chiller specification suited to the laser machining conditions, and records in the recording part 10. Subsequently, the processing advances to Step S206, and laser machining is executed.

In Step S221, the laser-oscillation reduction/interruption section 1106 conducts warning emergency processing to stop the laser oscillator 3 or cause the optical output to decrease, in order to avoid damage to the laser oscillator 3, etc. In Step S222, a stop reason such as "laser oscillator stopped due to temperature of laser oscillator exceeding allowed maximum temperature" is displayed on the display unit 7. In Step S223, due to a cause such as failure of the chiller being considered, the cause is investigated and the cause is eliminated. Subsequently, the processing returns to Step S202, and restarts the laser machining.

It should be noted that, in the case of taking a long time in successfully conclusion of the laser machining including a series of laser beam outputs, since there is a possibility of deviation between the predicted temperature and actual temperature enlarging due to prediction error, change in environmental temperature, etc., it may be configured so as to count the time by a timer, and every time a predetermined time elapses since the moment starting the laser machining, in the case of determining in Step S210 that execution of the laser beam output command has not completed, return to Step S203 instead of returning to Step S207, acquire the temperature data of each part, and calculate the maximum temperature reached, etc. again.

According to Modified Example 1 of the first embodiment, the following effects are exerted. Even if selecting a small-sized chiller that is low cost and has a small occupying space, since the laser machining is executed by the alternative-laser-machining-condition processing section 1104 automatically replacing with the alternative laser machining conditions, in the case of there being a possibility of the temperature of the laser oscillator 3 or coolant exceeding the predetermined respective allowed temperatures, unless an unexpected situation arises such as failure of the chiller 2, it is possible to overcome the problem in that the workpiece under machining becomes inferior due to detecting that the coolant or heat generating part such as the laser oscillator having excessively risen in temperature during laser machining, and stopping the laser oscillation or decreasing the laser beam output. In addition, even without a person intervening, it is possible to successfully conclude laser machining without the machining stopping.

(Modified Example 2 of First Embodiment)

Modified Example 2 of the first embodiment corresponds to the fourth aspect of the invention. The device configuration and flowchart of Modified Example 2 of the first embodiment are similar to the first embodiment or Modified Example 1 of the first embodiment. Modified Example 2 of the first embodiment has a configuration establishing the computational expression for obtaining the maximum temperature reached of each part that revises the computation expression of the first embodiment. In the fourth aspect, the at least one temperature detection part 6 among the temperature detection parts 6 is a temperature detection part 6 that detects the temperature of the environment in which at least one device among the laser device 1 and chiller 2 is installed. In the fourth aspect, using at least one set of data among environmental temperature dependence data of the cooling capacity of the chiller 2 and environmental temperature dependency data of the heat quantity infiltrating from outside to the cooled part of the laser device 1 recorded in the recording part 10, the temperature-rise calculation section 91 calculates the maximum temperature reached of the component or coolant, and determines if the laser oscillator 3, etc. is not exceeding the predetermined allowed maximum temperature $T_{max}$, or the like, at the set laser machining conditions. How it is specifically calculated will be mentioned briefly.

First, for consideration of the environmental temperature dependency of the cooling capacity of the chiller 2, it is simply best to calculate using the cooling capacity at the detected environmental temperature as the cooling capacity (P) of the chiller 2 in the aforementioned computational expression. Generally, since there are many cases of the environmental temperature dependency of the cooling capacity of the chiller 2 being considerably large, it is desirable to consider the environmental temperature dependency of the cooling capacity of the chiller 2. On the other hand, the heat quantity infiltrating from outside to the cooled part of the laser device 1 ($Q_{1c}(T'_i, T_c)$) is often small compared to the heat generation amount of the laser oscillator 3, etc., and thus it is not necessarily required to consider the heat quantity infiltrating from outside to the cooled part ($Q_{1c}(T'_i, T_c)$); however, there is the following such method in the case of considering.

First, Eq. (8) is used as an equation replacing Eq. (3).

[math 08]

$$\Delta t_i = t_{i+1} - t_i = \frac{T(t_{i+1}) - T(t_i) - \Delta T(Q_0) \times Q_{1H}/Q_0}{(Q_1 - P)/H_i} \quad \text{Equation(8)}$$

Herein, $T(t_{i+1})$, $T(t_i)$ are the LD temperature, $T(t_{i+1}) - T(t_i) = \Delta T$ = constant fine temperature difference, $t_{i+1} - t_i$ is the time required for temperature rise by $\Delta T$, $Q_{1H}$ is the heat generation amount of LD, and Eq. (9) written to consider the infiltrating heat quantity to the cooled part from outside is used as $Q_1$.

[math 09]

$$Q_1 = Q_{1H} + Q_{1C}(T'_i, T_c) = Q_{1H} + Q_{1C}(T_i, T_c) \quad \text{Equation 9}$$

Herein, ($Q_{1c}(T'_i, T_c)$) is the infiltrating heat quantity to the cooled part from outside, and is a function of the temperature of the cooled part ($T'_i$) and the environmental temperature ($T_c$), and is substantially a function of the temperature difference between $T'_i$ and $T_c$. Therefore, as the function for the temperature difference between $T_c$ and $T'_i$, the infiltrating heat quantity $Q_{1c}(T'_i, T_c)$ to the cooled part from outside may be recorded in the recording part 10. In addition, the temperature difference between the LD temperature $T_i$ and the cooled part temperature $T'_i$ is proportional to $Q_{1H}/Q_0$, similarly to the temperature difference $\Delta T$ ($Q_1$) between the LD temperature and coolant; therefore, $Q_{1c}(T'_i, T_c)$ can be defined as $Q_{1c}(T_i, T_c)$.

From Eq. (8) and Eq. (9), since it is possible to calculate the time until the LD temperature rises from a certain temperature $T_i$ by $\Delta T$ by considering the environmental temperature, the time change of the LD temperature taking account of the environmental temperature can be calculated by calculating $\Sigma \Delta t_i$. In a similar sequence as Eq. (3), it is possible to replace with a formula by which the time change of the LD temperature taking consideration of the environmental temperature can be calculated also for Eq. (4).

The following effects are exerted according to Modified Example 2 of the first embodiment. Since it is determined whether there is a possibility of the temperature rise of coolant or components such as the laser oscillator 3 exceeding the predetermined respective allowed temperatures by considering the change in the cooling capacity of the chiller 2, or change in the heat quantity infiltrating from outside to the cooled part of the laser device 1 from the environmental temperature changing, it is possible to accurately determine also in a case of the environmental temperature being high.

(Second Embodiment)

The second embodiment of the present invention will be explained. The second embodiment corresponds to the eighth aspect of the invention. The device configuration and flowchart of the second embodiment are similar to the first embodiment or Modified Example 1 of the first embodiment. In the laser device 1, at least one of the temperature detection parts 6 is installed at a position that detects at least one temperature among the temperature of the cooled portion of the laser oscillator 3 and the temperature of the coolant, and the data showing the relationship between the temperature detected by the temperature detection part 6 detecting the at least one temperature among the temperature of the cooled portion of the laser oscillator 3 and the temperature of the coolant, and the optical output characteristics of the laser device 1 are recorded in the recording part 10. The optical-output-command adjustment section 1107 can adjust the optical output command so that the laser output is stable, according to the change in temperature of the coolant or component for which the temperature rises by heat generation from the laser oscillator 3, etc., by referencing the data showing the relationship between the at least one temperature among the temperature of the cooled portion of the laser oscillator and the temperature of the coolant and the optical output characteristics of the laser device recorded in the recording part 10. Since the cooling capacity of the chiller 2 is small, the temperature of the laser oscillator 3 and coolant will change; however, even if the temperature changes, it is possible to stabilize the laser output.

It should be noted that, since the drive current of LD will be changed according to the LD temperature in order to stabilize the laser output, the heat generation amount of LD also changes. Therefore, the table data, etc. showing the relationship of the LD temperature with the laser beam output characteristics and heat generation characteristics are recorded in the recording part 10, the time change of the LD temperature can be calculated also for a case of the heat generation amount of LD changing, by calculating $\Sigma \Delta t_i$, similarly, with $Q_{1H}$ as the function of the LD temperature in Eq. (8) and Eq. (9), which take consideration of the heat quantity infiltrating from outside to the cooled part ($Q_{1c}(T'_i, T_c)$). By considering only the change in the heat generation amount of LD, in the case of there being no requirement to consider the heat quantity infiltrating from outside to the cooled part ($Q_{1c}(T'_i, T_c)$), ($Q_{1c}(T_i, T_c)$) in Eq. (9) may be set to zero.

According to the second embodiment, the following effects are exerted. Since the optical output command is adjusted so that the laser output stabilizes according to changes in the temperature of the coolant or component for which the temperature rises by heat generation from the laser oscillator 3, etc., by referencing data showing the relationship between the optical output characteristics of the laser device and at least one temperature among the temperature of the cooled portion of the laser oscillator 3 and the temperature of the coolant recorded in the recording part 10, it is possible to stabilize the laser output, even if the temperature of the laser oscillator 3 or coolant changes due to the cooling capacity of the chiller 2 being small.

(Third Embodiment)

A third embodiment of the present invention will be explained. The third embodiment corresponds to the ninth aspect of the invention. The device configuration and flowchart of the third embodiment are similar to the first embodiment or Modified Example 1 of the first embodiment. The laser device 1 can establish the control unit 11 as a numerical control. If a numerical control, it is possible to impart both functions of the calculation part 9 and recording part 10, and by calculating and determining whether or not there is a possibility of the temperature rise of the coolant or component for which the temperature rises by the heat generation from the laser oscillator 3, etc. exceeding the predetermined respective allowed temperatures $T_{max}$ in the numerical control for controlling the laser device 1, additions such as new components are unnecessary. Due to being calculation having a small load on the numerical control, and performing prior to laser machining, it will not influence other control.

According to the third embodiment, the following effect is exerted. If a numerical control, it is possible to impart both functions of the calculation part 9 and recording part 10, and it becomes possible to have the function of the abovementioned such control unit 11, without additions such as new components, in the numerical control for controlling the laser device 1.

(Fourth Embodiment)

A fourth embodiment of the present invention will be explained. The fourth embodiment corresponds to a tenth aspect of the invention. In FIG. 1, it is illustrated so that one control unit 11 is provided to one laser device 1; however, the laser device 1 can share the control unit 11 with a plurality of the laser devices 1. The other device configurations and flowcharts are the same as the first embodiment or Modified Example 1 of the first embodiment. A cost reduction is achieved by calculating and determining whether or not there is a possibility of the temperature rise of the coolant or component for which the temperature rises by heat generation from the laser oscillator 3, etc. exceeding the predetermined respective allowed temperatures $T_{max}$ with one control unit 11 or numerical control, relative to a plurality of the laser devices 1.

According to the fourth embodiment, the following effect is exerted. A cost reduction is achieved by sharing one control unit 11 or numerical control with a plurality of the laser devices 1.

Although the first embodiment to fourth embodiment of the present invention have been explained above, the present invention is not to be limited to the aforementioned embodiments. In addition, the effects described in the first embodiment to fourth embodiment are merely listing the most favorable effects produced from the present invention, and the effects according to the present invention are not to be limited to those described in the first embodiment to fourth embodiment.

The control method by the control unit 11 is realized by way of software. In the case of being realized by software, the programs constituting this software are installed to a computer (control unit 11). In addition, these programs may be recorded in removable media and distributed to the user, or may be distributed by being downloaded to the computer of the user via a network. Furthermore, these programs may be provided to the computer (control unit 11) of the user as a Web service via a network, without being downloaded.

EXPLANATION OF REFERENCE NUMERALS

1 laser device
2 circulation-type coolant supply device (chiller)
3 laser oscillator
4 power supply unit
5 output light detection part
6 temperature detection part
7 display unit
8 input unit
9 calculation part
10 recording part
11 control unit
12 laser optical system
13 coolant pipe
14 laser beam
15 tank
16 cooling device
17 heat exchanger
18 discharge pump
91 temperature-rise calculation section
1101 heat generation amount acquisition section
1102 alternative-laser-machining-condition creation section
1103 required-chiller specification creation section
1104 alternative-laser-machining-condition processing section
1105 laser-device-characteristics update section 1106 laser-oscillation reduction/interruption section
1107 optical-output-command adjustment section

What is claimed is:

1. A laser device, for use with a chiller that is a circulation-type coolant supply device, the laser device cooling at least heat emanating from a laser oscillator using the chiller, the laser device comprising:
    at least one laser oscillator;
    a power supply unit that supplies electric power for laser oscillation to the laser oscillator;
    an output light detection part that detects laser beam output from the laser oscillator;
    a laser optical system for outputting a laser beam from the laser device;
    at least one temperature detection part that detects temperature of coolant or a component for which temperature rises by heat generation from at least the laser oscillator;
    an input unit;
    a display unit;
    a recording part that records characteristics of the laser device including optical output characteristics of the laser oscillator, and characteristics of the chiller;
    a calculation part that calculates a state of the laser device; and
    a control unit that controls each part of the laser device,
    wherein the calculation part calculates, according to a command from the control unit, the state of the laser device based on (i) cooling capacity of the chiller and tank volume of the chiller, (ii) at least a heat generation amount from the laser oscillator, and (iii) heat capacity of a cooled part of the laser device to be cooled by the coolant, which are recorded in the recording part, relative to laser machining conditions including (a) at least one set of output command data among optical output command data to the laser oscillator and (b) power output command data for the laser oscillator to the power supply unit, which were inputted through the input unit or set,
    wherein the control unit predicts whether the temperature of the coolant or the component will exceed predetermined respective allowed temperatures, in a case of assuming that machining has been performed at the laser machining conditions that have been inputted or set, by referencing the state of the laser device calculated by the calculation part, and
    wherein the control unit has at least one function, among (i) function of displaying on the display unit a warning of excessive temperature rise and (ii) a function of recording a warning of excessive temperature rise in the recording part, prior to starting laser machining, in a case that the control unit has predicted the temperature of the coolant or the component exceed the predetermined respective allowed temperatures.

2. The laser device according to claim 1, wherein the control unit further has at least one function among:
    a function of displaying on the display unit an alternative laser machining condition at which the temperature of the coolant or the component will not exceed the predetermined respective allowed temperatures,
    a function of recording the alternative laser machining condition in the recording part, and
    a function of executing laser machining by automatically replacing the laser machining condition with the alternative laser machining condition,
    in the case that the control unit has predicted that the temperature of the coolant or the component exceeds the predetermined respective allowed temperatures.

3. The laser device according to claim 1, wherein the control unit further:
    sends a command to the power supply unit so as to supply at least one of a current or voltage of a predetermined value to the laser oscillator, following a predetermined schedule that is set;
    receives power data supplied to the laser oscillator from the power supply unit and optical output data from the output light detection part; and
    updates at least one characteristic recorded in the recording part among the optical output characteristics of the laser device representing characteristics of a laser beam output relative to current or voltage supplied from the power supply unit, and heat generation characteristics of the laser oscillator representing a heat generation amount of the laser oscillator relative to current or voltage supplied from the power supply unit.

4. The laser device according to claim 1,
    wherein at least one temperature detection part among the temperature detection parts is a temperature detection part that detects temperature of an environment in which at least one device among the laser device and the chiller is installed,
    wherein at least one set of data among environmental temperature dependency data of the cooling capacity of the chiller and environmental temperature dependency data of a heat quantity infiltrating from outside to the cooled part of the laser device is recorded in the recording part,
    wherein the calculation part further calculates the state of the laser device using at least one set of data among data of the cooling capacity of the chiller and data of a heat quantity infiltrating from outside to the cooled part, at the environmental temperature detected by the temperature detection part, and
    wherein the control unit further determines whether there is a possibility of the temperature of the coolant or the component for which the temperature rises by heat generation from at least the laser oscillator exceeding predetermined respective allowed temperatures, at the laser machining condition that was inputted or set, by referencing a calculation result of the state of the laser device calculated by the calculation part.

5. The laser device according to claim 1,
    wherein the control unit further has a function of stopping laser oscillation or decreasing laser beam output, in a case of the temperature rise of the coolant or the component for which temperature rises by heat generation from at least the laser oscillator having exceeded the predetermined respective allowed temperatures.

6. The laser device according to claim 1,
    wherein the control unit further has at least one function among a function of displaying a specification of a required chiller for machining without changing the laser machining conditions on the display unit, by referencing a calculation result of the state of the laser device calculated by the calculation part, according to a request inputted from the input unit or a setting, and a function of recording the specification in the recording part,
    in a case of determining that there is a possibility that the temperature rise of the coolant or the component for which the temperature rises by heat generation from at least the laser oscillator will exceed predetermined respective allowed temperatures, for the laser machining condition that was inputted from the input unit or set.

7. The laser device according to claim 1, wherein the recording part, in order that the calculation part calculates whether there is a possibility of the temperature of the coolant or the component for which the temperature rises by heat generation from at least the laser oscillator exceeding predetermined respective allowed temperatures, at the laser machining condition that was set, based on the cooling capacity of the chiller and tank volume of the chiller, heat generation amount from at least the laser oscillator and heat capacity of the cooled part of the laser device to be effectively cooled by the coolant, according to a command from the control unit, records in advance in the recording part at least a computational expression for calculating a heat generation amount from at least the laser oscillator according to the laser machining condition, and a computational expression that calculates a temperature rise of the coolant or the component for which temperature rises by heat generation from at least the laser oscillator, in addition to recording in advance at least the cooling capacity of the chiller and tank volume of the chiller, and heat capacity of the cooled part of the laser device to be effectively cooled by the coolant.

8. The laser device according to claim 1, wherein at least one of the temperature detection parts is installed at a position for detecting at least one temperature among the temperature of a cooled portion of the laser oscillator and the temperature of the coolant, and data indicating a relationship between the optical output characteristics of the laser device and the temperature detected by the temperature detection part that detects the at least one temperature among the temperature of the cooled portion of the laser oscillator and the temperature of the coolant is recorded in the recording part, and wherein the control unit further has a function of adjusting an optical output command so that laser output becomes stable, according to a change in the temperature of the coolant or the component for which the temperature rises by heat generation from at least the laser oscillator, by referencing the data recorded in the recording part that indicates the relationship between the optical output characteristics of the laser device and the temperature detected by the temperature detection part that detects the at least one temperature among the temperature of the cooled portion of the laser oscillator and the temperature of the coolant.

9. The laser device according to claim 1, wherein the control unit is a numerical control.

10. The laser device according to claim 1, wherein the laser device shares the control unit between a plurality of the laser devices.

* * * * *